United States Patent
Song et al.

(10) Patent No.: US 9,935,238 B2
(45) Date of Patent: Apr. 3, 2018

(54) LIGHT-EMITTING ELEMENT AND LIGHTING SYSTEM

(71) Applicant: LG INNOTEK CO., LTD., Seoul (KR)

(72) Inventors: Ki Young Song, Seoul (KR); Hyun Chul Lim, Seoul (KR); Myung Hoon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/302,387

(22) PCT Filed: Apr. 7, 2015

(86) PCT No.: PCT/KR2015/003488
§ 371 (c)(1),
(2) Date: Oct. 6, 2016

(87) PCT Pub. No.: WO2015/156588
PCT Pub. Date: Oct. 15, 2015

(65) Prior Publication Data
US 2017/0025566 A1    Jan. 26, 2017

(30) Foreign Application Priority Data

Apr. 7, 2014  (KR) .................. 10-2014-0041243
Apr. 16, 2014 (KR) .................. 10-2014-0045576

(51) Int. Cl.
*H01L 27/15* (2006.01)
*H01L 33/04* (2010.01)
(Continued)

(52) U.S. Cl.
CPC .............. *H01L 33/04* (2013.01); *H01L 21/00* (2013.01); *H01L 27/15* (2013.01); *H01L 29/18* (2013.01);
(Continued)

(58) Field of Classification Search
CPC ......... H01L 33/00; H01L 33/04; H01L 33/08; H01L 33/14; H01L 33/36; H01L 3/38;
(Continued)

(56) References Cited

U.S. PATENT DOCUMENTS 8,283,191 B2 * 10/2012 Rode ................. H01L 33/22
257/103
8,294,178 B2 * 10/2012 Koo .................. H01L 33/14
257/101
(Continued)

FOREIGN PATENT DOCUMENTS

CN         102217105 A       10/2011
DE   10 2011 056 888 A1     6/2013
(Continued)

*Primary Examiner* — Dao H Nguyen
(74) *Attorney, Agent, or Firm* — Birch, Stewart, Kolasch & Birch, LLP

(57) ABSTRACT

An embodiment relates to a light-emitting element, a method for producing same, a light-emitting element package, and a lighting system. A light-emitting element according to the embodiment may comprise: a first conductive semiconductor layer (112); a second conductive semiconductor layer (116) disposed below the first conductive semiconductor layer (112); an active layer (114) disposed between the first conductive semiconductor layer (112) and the second conductive semiconductor layer (116); a plurality of holes (H) exposing parts of the first conductive semiconductor layer (112) to the bottom surface of the second conductive semiconductor layer (116) by penetrating the second conductive semiconductor layer (116) and the active layer (114); first contact electrodes (160) electrically connected to the first conductive semiconductor layer (112) from the bottom surface of the second conductive semiconductor layer (116) through the plurality of holes (H); an insulation layer (140) disposed between the first contact electrode (160) and the plurality of holes (H); a bonding
(Continued)

layer (156) electrically connected to the first contact electrodes (160); a support member (158) disposed below the bonding layer (156); a second contact electrode (132) electrically connected to the second conductive semiconductor layer (116); and a first current-spreading semiconductor layer (191) inside the first conductive semiconductor layer (112) above the first contact electrode (160).

19 Claims, 18 Drawing Sheets

(51) Int. Cl.

| | | |
|---|---|---|
| *H01L 33/38* | (2010.01) | |
| *H01L 33/44* | (2010.01) | |
| *H01L 21/00* | (2006.01) | |
| *H01L 29/18* | (2006.01) | |
| *H01L 29/72* | (2006.01) | |
| *H01L 33/08* | (2010.01) | |
| *H01L 33/14* | (2010.01) | |
| *H01L 33/62* | (2010.01) | |
| *H01L 33/46* | (2010.01) | |
| *H01L 33/00* | (2010.01) | |

(52) U.S. Cl.
CPC ............. *H01L 29/72* (2013.01); *H01L 33/08* (2013.01); *H01L 33/14* (2013.01); *H01L 33/38* (2013.01); *H01L 33/382* (2013.01); *H01L 33/62* (2013.01); *H01L 33/0079* (2013.01); *H01L 33/44* (2013.01); *H01L 33/46* (2013.01)

(58) Field of Classification Search
CPC ......... H01L 33/44; H01L 33/46; H01L 33/62; H01L 27/15; H01L 21/00; H01L 29/18; H01L 29/72

USPC ............ 257/79, 93, 94, 98, 99, 101, E27.12, 257/E27.121, E33.005, E33.034, E33.048, 257/E33.055; 438/27, 29

See application file for complete search history.

(56) References Cited

U.S. PATENT DOCUMENTS

| | | | |
|---|---|---|---|
| 8,872,209 B2* | 10/2014 | Maute | H01L 33/382 257/79 |
| 2006/0192207 A1 | 8/2006 | Wook Shim et al. | |
| 2008/0237622 A1 | 10/2008 | Choi et al. | |
| 2010/0096652 A1 | 4/2010 | Choi et al. | |
| 2011/0049555 A1 | 3/2011 | Engl et al. | |
| 2011/0101390 A1* | 5/2011 | Engl | H01L 27/156 257/93 |
| 2012/0001223 A1 | 1/2012 | Inoue et al. | |
| 2012/0086033 A1 | 4/2012 | Kim | |
| 2012/0086043 A1 | 4/2012 | Cho | |
| 2013/0292643 A1 | 11/2013 | Kuo et al. | |
| 2014/0048838 A1 | 2/2014 | Yang et al. | |
| 2015/0014716 A1 | 1/2015 | Von Malm | |

FOREIGN PATENT DOCUMENTS

| | | |
|---|---|---|
| EP | 2 398 075 A1 | 12/2011 |
| EP | 2 439 794 A2 | 4/2012 |
| EP | 2 439 796 A2 | 4/2012 |
| JP | 2009-252826 A | 10/2009 |
| KR | 10-2006-0095689 A | 9/2006 |
| KR | 10-2007-0095089 A | 9/2007 |
| KR | 10-2010-0044726 A | 4/2010 |
| KR | 10-2010-0134581 A | 12/2010 |

* cited by examiner

LIGHT-EMITTING ELEMENT AND LIGHTING SYSTEM

CROSS REFERENCE TO RELATED APPLICATIONS

This application is the National Phase of PCT International Application No. PCT/KR2015/003488, filed on Apr. 7, 2015, which claims priority under 35 U.S.C. 119(a) to Patent Application Nos. 10-2014-0041243, filed in Republic of Korea on Apr. 7, 2014 and 10-2014-0045576, filed in Republic of Korea on Apr. 16, 2014, all of which are hereby expressly incorporated by reference into the present application.

TECHNICAL FIELD

An embodiment relates to a light-emitting element, a method for producing the same, a light-emitting element package, and a lighting system.

BACKGROUND ART

A light-emitting element (light-emitting device) is a p-n junction diode which converts electrical energy into light energy. The light-emitting element may be produced using compound semiconductors of groups III and V in the periodic table, and may implement various colors by adjusting a composition ratio of the compound semiconductors.

The light-emitting element emits energy corresponding to a band-gap energy between a conduction band and a valance band when electrons of an n-type layer and holes of a p-type layer recombine upon application of a forward voltage. This energy is usually emitted in the form of heat or light. The light-emitting element emits the energy in the form of light.

For example, a nitride semiconductor has received much attention in development fields of optical devices and high-power electronic devices due to its high thermal stability and wide band-gap energy. In particular, a blue light-emitting element, a green light-emitting element, an ultraviolet (UV) light-emitting element, and the like using the nitride semiconductor have become commercialized and are widely used.

An example of a light-emitting element according to the related art is a lateral-type light-emitting element in which an electrode layer is disposed in one direction of an epi-layer. In the lateral-type light-emitting element, an operating voltage (Vf) of the light-emitting element increases due to a narrow current flow, causing a reduction in current efficiency. Thus, there is a problem that the lateral-type light-emitting element is vulnerable to electrostatic discharge.

In order to solve such a problem, a via hole-based vertical-type light-emitting element has been developed. In the via hole-based vertical-type light-emitting element, a via hole is formed below an epi-layer and an electrode is disposed therein.

In the related art, in order to produce the via hole-based vertical-type light-emitting element, a plurality of mesa etching processes are performed for forming an n-contact, and an insulation layer is formed between the n-contact and a mesa etching hole.

According to the related art, electrons injected through a via hole cause an electron clouding phenomenon in the vicinity of the via hole, and these electrons flow through the vicinity of the via hole. Thus, light is generated in only a partial region of an active layer and luminous flux is low accordingly.

DISCLOSURE OF THE INVENTION

Technical Problem

An embodiment provides a light-emitting element capable of improving luminous flux, a method for producing the same, a light-emitting element package, and a lighting system.

TECHNICAL SOLUTION

A light-emitting element according to the embodiment may comprise: a first conductive semiconductor layer (112); a second conductive semiconductor layer (116) disposed below the first conductive semiconductor layer (112); an active layer (114) disposed between the first conductive semiconductor layer (112) and the second conductive semiconductor layer (116); a plurality of holes (H) exposing parts of the first conductive semiconductor layer (112) to the bottom surface of the second conductive semiconductor layer (116) by penetrating the second conductive semiconductor layer (116) and the active layer (114); first contact electrodes (160) electrically connected to the first conductive semiconductor layer (112) from the bottom surface of the second conductive semiconductor layer (116) through the plurality of holes (H); an insulation layer (140) disposed between the first contact electrode (160) and the plurality of holes (H); a bonding layer (156) electrically connected to the first contact electrodes (160); a support member (158) disposed below the bonding layer (156); a second contact electrode (132) electrically connected to the second conductive semiconductor layer (116); and a first current-spreading semiconductor layer (191) inside the first conductive semiconductor layer (112) above the first contact electrode (160)

A light-emitting element according to another embodiment may comprise: a light-emitting structure layer (210) including a first conductive semiconductor layer (212), a second conductive semiconductor layer (216), and an active layer (214) disposed between the first conductive semiconductor layer (212) and the second conductive semiconductor layer (216); a plurality of holes (H) exposing parts of the first conductive semiconductor layer (212) to the bottom surface of the second conductive semiconductor layer (216) by penetrating the second conductive semiconductor layer (216) and the active layer (214); first contact electrodes (260) electrically connected to the first conductive semiconductor layer (212) from the bottom surface of the second conductive semiconductor layer (216) through the plurality of holes (H); an insulation layer (240) disposed between the first contact electrode (260) and the plurality of holes (H); a first electrode layer (250) electrically connected to the first contact electrode (260); a second contact electrode (232) electrically connected to the second conductive semiconductor layer (216); and a division layer (290) dividing the light-emitting structure layer (210) into a plurality of cells.

A lighting system according to an embodiment may comprise a light-emitting unit including the light-emitting element.

Advantageous Effects

According to embodiments, it is possible to provide a light-emitting element capable of improving luminous flux, a method for producing same, a light-emitting element package, and a lighting system.

According to embodiments, it is possible to provide a large-sized light-emitting element which exhibits high optical efficiency at a low current, a method for producing the same, a light-emitting element package, and a lighting system.

MODE FOR CARRYING OUT THE INVENTION

In the description of embodiments, it will be understood that when a layer (film), region, pattern, or structures is referred to as being "on/above" or "below/under" a substrate, another layer (film), region, pad, or patterns, it can be directly on or below another layer (film), region, pad, or patterns, and one or more intervening layer may also be present therebetween. Additionally, the criteria for "on/above" and "below/under" is based on the drawings.

EMBODIMENTS

Figure 1:
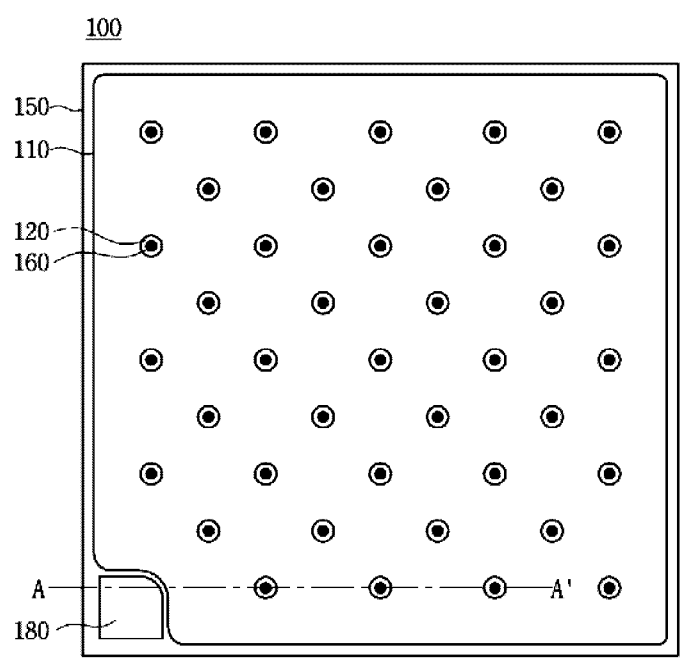
FIG. 1 is a plan projection view of a light-emitting element according to an embodiment.
Figure 2:
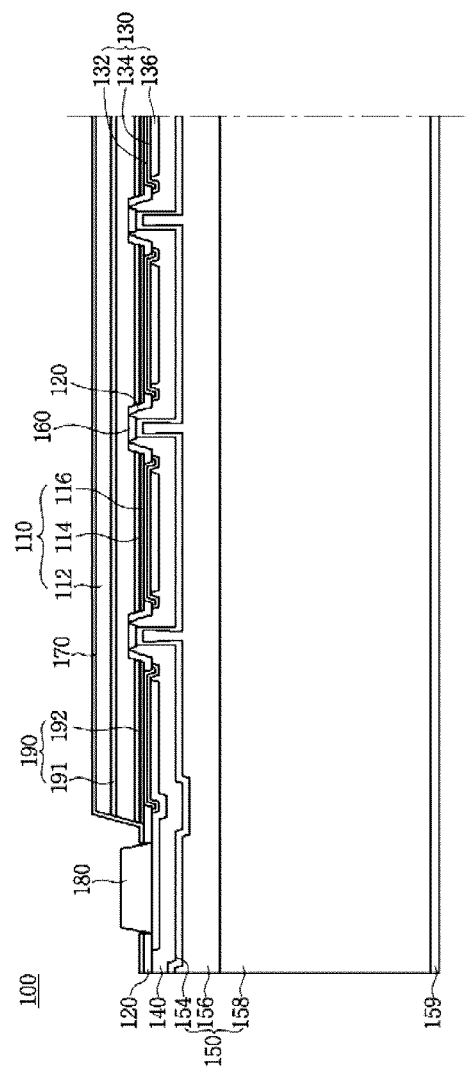
FIG. 2 is an enlarged cross-sectional view of a light-emitting element according to an embodiment.

FIG. 1 is a plan projection view of a light-emitting element 100 according to an embodiment, and FIG. 2 is an enlarged cross-sectional view taken along line A-A' of FIG. 1.

The light-emitting element 100 according to the embodiment may include: a first conductive semiconductor layer 112; a second conductive semiconductor layer 116 disposed below the first conductive semiconductor layer 112; an active layer 114 disposed between the first conductive semiconductor layer 112 and the second conductive semiconductor layer 116; a plurality of holes H exposing parts of the first conductive semiconductor layer 112 to the bottom surface of the second conductive semiconductor layer 116 by penetrating the second conductive semiconductor layer 116 and the active layer 114; first contact electrodes 160 electrically connected to the first conductive semiconductor layer 112 from the bottom surface of the second conductive semiconductor layer 116 through the plurality of holes H; an insulation layer 140 disposed between the first contact electrodes 160 and the plurality of holes H; a first electrode layer 150 electrically connected to the first contact electrodes 160; and a second contact electrode 132 electrically connected to the second conductive semiconductor layer 116.

The first electrode layer 150 may include a bonding layer 156 electrically connected to the first contact electrodes 160, and a support member 158 disposed below the bonding layer 156.

The embodiment is directed to providing the light-emitting element capable of improving luminous flux.

To this end, the embodiment may include a first current-spreading semiconductor layer 191 inside the first conductive semiconductor layer 112 above the first contact electrode 160.

The first current-spreading semiconductor layer 191 may include a first conductive AlGaN/GaN superlattice layer or a first conductive AlGaN/GaN/InGaN superlattice layer, but is not limited thereto.

According to the embodiment, since the first current-spreading semiconductor layer 191 made of n-AlGaN/GaN SLs or n-AlGaN/GaN/InGaN SLs is disposed above the first contact electrodes 160 formed in the via hole H, injected electrons flow while spreading in a lateral direction and the electrons are injected into an entire area of an active layer (MQW). Thus, a larger light emission area is provided as compared to an existing structure.

The embodiment may further include a second current-spreading semiconductor layer 192 between the active layer 114 and the first conductive semiconductor layer 112. The first current-spreading semiconductor layer 191 and the second current-spreading semiconductor layer 192 may be collectively referred to as a current-spreading semiconductor layer 190.

In the embodiment, the second current-spreading semiconductor layer 192 may be disposed to be lower than the first contact electrodes 160.

According to the embodiment, the electrons injected by the first contact electrodes 160 or the electrons spread from the first current-spreading semiconductor layer 191 are additionally spread by arranging the second current-spreading semiconductor layer 192 between the active layer 114 and the first conductive semiconductor layer 112. Thus, carrier injection efficiency may be improved to increase luminous flux.

According to the embodiment, it is possible to provide a light-emitting element capable of improving luminous flux, the method for producing the same, a light-emitting element package, and a lighting system.

Hereinafter, a method for producing a light-emitting element according to an embodiment will be described with reference to FIGS. 3 to 13.

Figure 3:
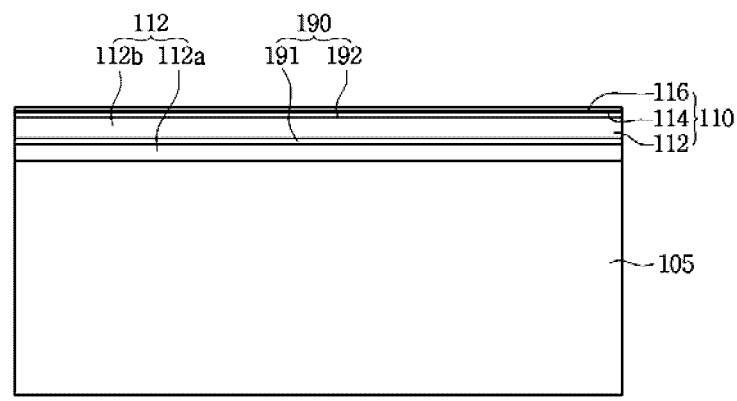
FIGS. 3 to 13 are process cross-sectional views of a method for producing a light-emitting element according to an embodiment.

First, as illustrated in FIG. 3, a light-emitting structure layer 110 may be formed above a growth substrate 105. The light-emitting structure layer 110 may include a first conductive semiconductor layer 112, an active layer 114, and a second conductive semiconductor layer 116.

The embodiment may include a current-spreading semiconductor layer 190 for increasing luminous flux, and the current-spreading semiconductor layer 190 may include a first current-spreading semiconductor layer 191 and a second current-spreading semiconductor layer 192.

For example, the embodiment may include the first current-spreading semiconductor layer 191 formed inside the first conductive semiconductor layer 112.

The first current-spreading semiconductor layer 191 may include a first conductive AlGaN/GaN superlattice layer or a first conductive AlGaN/GaN/InGaN superlattice layer, but is not limited thereto.

Referring to FIG. 2, in the embodiment, since the first current-spreading semiconductor layer 191 made of n-AlGaN/GaN SLs or n-AlGaN/GaN/InGaN SLs is disposed above a first contact electrodes 160 to be formed later, injected electrons flow while spreading in a lateral direction and the electrons are injected into an entire area of an active layer (MQW). Thus, a larger light emission area is provided as compared to an existing structure.

The embodiment may further include a second current-spreading semiconductor layer 192 between the active layer 114 and the first conductive semiconductor layer 112.

In the embodiment, the second current-spreading semiconductor layer 192 may be disposed to be lower than the first contact electrodes 160 to be formed later.

According to the embodiment, the electrons injected by the first contact electrodes 160 or the electrons spread from the first current-spreading semiconductor layer 191 are additionally spread by arranging the second current-spreading semiconductor layer 192 between the active layer 114 and the first conductive semiconductor layer 112. Thus, carrier injection efficiency may be improved to increase luminous flux.

According to the embodiment, it is possible to provide the light-emitting element capable of improving luminous flux.

In the embodiment, the first conductive semiconductor layer 112 may include a first semiconductor layer 112a of a first conductive type above the growth substrate 105, and a first second semiconductor layer 112b of the first conductive type formed after the first current-spreading semiconductor layer 101 is formed.

The growth substrate 105 is loaded into a growth apparatus, and a layer or a pattern may be formed above the growth substrate 105 by using a compound semiconductor of group II to VI elements.

The growth apparatus may employ an electron beam evaporator, a physical vapor deposition (PVD) apparatus, a chemical vapor deposition (CVD) apparatus, a plasma laser deposition (PLD) apparatus, a dual-type thermal evaporator, a sputtering apparatus, a metal organic chemical vapor deposition (MOCVD) apparatus, or the like, but is not limited to these apparatuses.

The growth substrate 105 may be a conductive substrate or an insulating substrate. For example, the growth substrate 105 may be selected from the group consisting of a sapphire substrate ($Al_2O_3$), GaN, SiC, ZnO, Si, GaP, InP, $Ga_2O_3$, and GaAs.

A buffer layer (not illustrated) may be formed above the growth substrate 105. The buffer layer reduces a difference of a lattice constant between the growth substrate 105 and a nitride semiconductor layer and may be made of a material selected from GaN, AlN, AlGaN, InGaN, InN, InAlGaN, AlInN, AlGaAs, GaP, GaAs, GaAsP, and AlGaInP.

An undoped semiconductor layer (not illustrated) may be formed above the buffer layer. The undoped semiconductor layer may be made of an undoped GaN-based semiconductor. The undoped semiconductor layer may be a semiconductor layer having lower conductivity than that of an n-type semiconductor layer.

Subsequently, a first conductive semiconductor layer 112 may be formed above the buffer layer or the undoped semiconductor layer. Subsequently, an active layer 114 may be formed above the first conductive semiconductor layer 112, and a second conductive semiconductor layer 116 may be sequentially stacked above the active layer 114.

Another layer may be further disposed above or below each of the above-described semiconductor layers. For example, a superlattice structure may be formed by using a group III-V compound semiconductor layer, but the present invention is not limited thereto.

The first conductive semiconductor layer 112 may be selected from compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. For example, the first conductive semiconductor layer 112 may be a semiconductor layer having an empirical formula of $In_xAl_yGa_{1-x-y}N$ ($0 \leq x \leq 1, 0 \leq y \leq 1, 0 \leq x+y \leq 1$).

The first conductive semiconductor layer 112 may be an n-type semiconductor layer, and the first conductive dopant may include an n-type dopant such as Si, Ge, Sn, Se, and Te.

The first conductive semiconductor layer 112 may be a single layer or a multi-layer, and may have a superlattice structure in which two different layers selected from GaN, AlN, AlGaN, InGaN, InN, InAlGaN, AlInN, AlGaAs, GaP, GaAs, GaAsP, and AlGaInP are alternately disposed.

The active layer 114 may have a single quantum well structure, a multiple quantum well structure, a quantum wire structure, or a quantum dot structure. The active layer 114 may be formed by using a compound semiconductor material of group III-V elements in a cycle of a well layer and a barrier layer. The well layer may include a semiconductor layer having an empirical formula of $In_xAl_yGa_{1-x-y}N$ ($0 \leq x \leq 1, 0 \leq y \leq 1, 0 \leq x+y \leq 1$), and the barrier layer may include a semiconductor layer having an empirical formula of $In_xAl_yGa_{1-x-y}N$ ($0 \leq x \leq 1, 0 \leq y \leq 1, 0 \leq x+y \leq 1$). The barrier layer may be made of a material having a higher band gap than that of the well layer.

The active layer 114 may have at least one cycle selected from, for example, a cycle of InGaN well layer/GaN barrier layer, a cycle of InGaN well layer/AlGaN barrier layer, and a cycle of InGaN well layer/InGaN barrier layer.

The second conductive semiconductor layer 116 may be formed above the active layer 114, and the second conductive semiconductor layer 116 may be selected from compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. The second conductive semiconductor layer 116 may be a semiconductor layer having an empirical formula of $In_xAl_yGa_{1-x-y}N$ ($0 \leq x \leq 1, 0 \leq y \leq 1, 0 \leq x+y \leq 1$).

The second conductive semiconductor layer 116 may be a p-type semiconductor layer, and the second conductive dopant may include a p-type dopant such as Mg and Zn. The second conductive semiconductor layer 116 may be a single layer or a multi-layer, but is not limited thereto.

The second conductive semiconductor layer 116 may have a superlattice structure in which two different layers selected from GaN, AlN, AlGaN, InGaN, InN, InAlGaN, AlInN, AlGaAs, GaP, GaAs, GaAsP, and AlGaInP are alternately disposed.

The first conductive semiconductor layer 112, the active layer 114, and the second conductive semiconductor layer 116 may be defined as a light-emitting structure layer 110. Additionally, a third conductive semiconductor layer (not illustrated), for example, a semiconductor layer having an opposite polarity to the second conductive semiconductor layer, may be formed above the second conductive semiconductor layer 116.

Accordingly, the light-emitting structure layer 110 may include at least one selected from an n-p junction structure, a p-n junction structure, an n-p-n junction structure, and a p-n-p junction structure. In the following description, it is assumed that the second conductive semiconductor layer 116 is disposed on the uppermost layer of the light-emitting structure layer 110.

Figure 4:
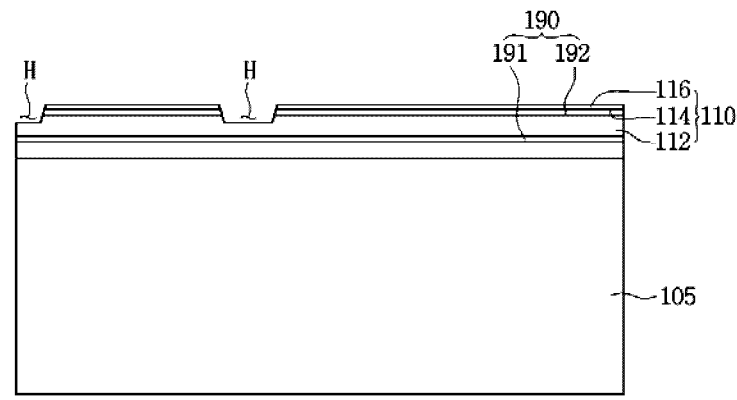

Subsequently, as illustrated in FIG. 4, a mesa etching process may be performed to remove a part of the light-emitting structure layer 110 and a part of the second current-spreading semiconductor layer 192.

For example, a plurality of holes H exposing parts of the first conductive semiconductor layer 112 by penetrating the second conductive semiconductor layer 116, the active layer 114, and the second current-spreading semiconductor layer 192 may be formed.

In the embodiment, the plurality of holes H may form a predetermined angle from the first conductive semiconductor layer 112 to the top surface of the second conductive semiconductor layer 116, for example, an obtuse angle with respect to the top surface of the light-emitting structure layer 110.

In the embodiment, a horizontal width of the plurality of holes H may be gradually reduced downward. On the other hand, in FIG. 2, the horizontal width of the plurality of holes H may be gradually reduced upward.

With reference to FIG. 2, according to the embodiment, since the horizontal width of the plurality of holes H is gradually reduced upward, the removed regions of the active layer 114 and the first conductive semiconductor layer 112 may be reduced, contributing to luminous efficiency.

Figure 5:
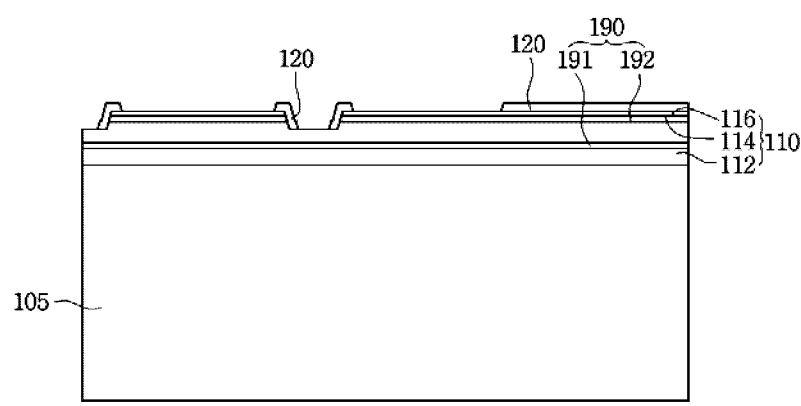

Subsequently, as illustrated in FIG. 5, a channel layer 120 may be formed above the plurality of holes H. The channel layer 120 may not be formed in a region where a first contact electrode 160 is to be formed. In this way, a part of the first conductive semiconductor layer 112 may be exposed.

The channel layer 120 may function as an electrically insulating layer between the first contact electrode 160 to be formed, the active layer 114, and the second conductive semiconductor layer 116.

The channel layer 120 may be made of one or more materials selected from $SiO_x$, $SiO_xN_y$, $Al_2O_3$, and $TiO_2$.

Additionally, in the embodiment, the reflectivity of the channel layer 120 may exceed 50%. For example, the channel layer 120 may be made of an insulating material selected from $SiO_2$, $SiO_x$, $SiO_xN_y$, $Si_3N_4$, $Al_2O_3$, and $TiO_2$, and may be made of a mixture of the insulating material and a light-reflecting material.

For example, the channel layer 120 may be made of a mixture of the insulating material and one or more materials selected from Ag, Ni, Al, Rh, Pd, Ir, Ru, Mg, Zn, Pt, Au, and Hf.

According to the embodiment, when the emitted light travels downward, the channel layer 120 also reflects the light, thereby minimizing light absorption and increasing luminous efficiency.

Figure 6:
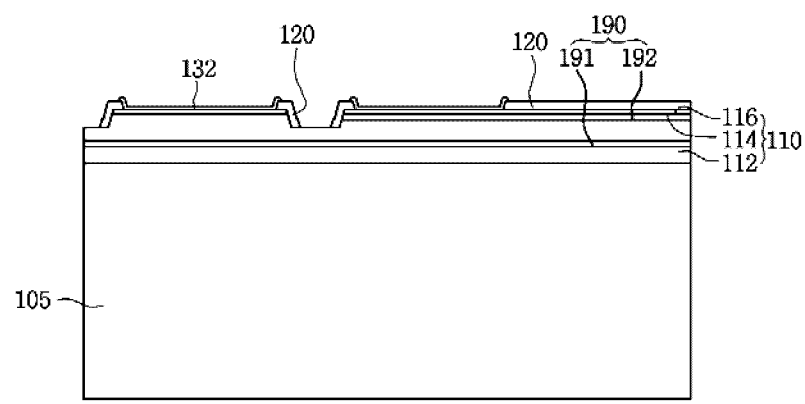

Subsequently, as illustrated in FIG. 6, a second contact electrode 132 may be formed above the second conductive semiconductor layer 116.

The second contact electrode 132 ohmic-contacts the second conductive semiconductor layer 116. The second contact electrode 132 may include at least one conductive material and may be a single layer or a multi-layer.

For example, the second contact electrode 132 may include at least one of a metal, a metal oxide, and a metal nitride.

The second contact electrode 132 may include a light-transmitting material. For example, the second contact electrode 132 may include at least one of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni/$IrO_x$/Au, Ni/$IrO_x$/Au/ITO, Pt, Ni, Au, Rh, and Pd.

Figure 7:
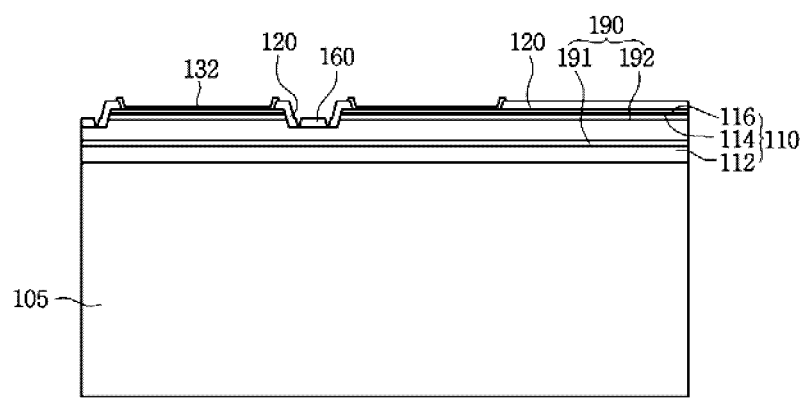

Subsequently, as illustrated in FIG. 7, a first contact electrode 160 may be formed above the exposed first conductive semiconductor layer 112.

The first contact electrode 160 may ohmic-contact the exposed first conductive semiconductor layer 112. When viewed from above, the first contact electrode 160 may have a circular or polygonal shape, but is not limited thereto.

The top surface of the first contact electrode 160 may be disposed between the top surface of the active layer 114 and the top surface of the first conductive semiconductor layer 112.

The surface of the first conductive semiconductor layer 112, which contacts the first contact electrode 160, may be formed to have a flat structure as a Ga-face, but is not limited thereto.

With reference to FIG. 7, in the embodiment, the width of the first contact electrode 160 may be gradually increased toward the top surface from the bottom surface. With reference to FIG. 2, the width of the first contact electrode 160 may be gradually reduced toward the bottom surface from the top surface.

In this way, a probability of shorting between the first contact electrode 160 and a second electrode layer 130 to be formed later is reduced, and a region occupied by the first contact electrode 160 is reduced while maximizing a region where the first contact electrode 160 contacts the first conductive semiconductor layer 112, thereby increasing luminous efficiency.

When described with reference to FIG. 2, a horizontal width of the bottom surface of the first contact electrode 160 matches a horizontal width of a diffusion barrier layer 154 contacting the first contact electrode 160. Thus, it is possible to prevent deterioration of electrical characteristics while minimizing a region occupied by the diffusion barrier layer 154 and the first contact electrode 160.

Figure 8:
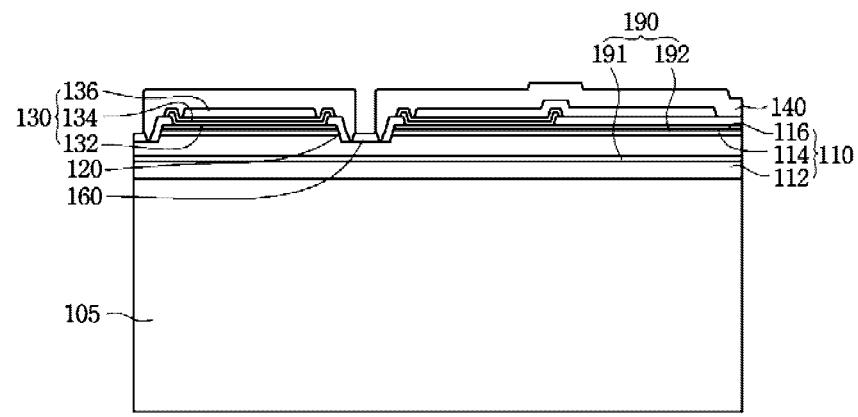

Subsequently, as illustrated in FIG. 8, a reflection layer 134 may be formed above the second contact electrode 132.

The reflection layer 134 may be disposed above the second contact electrode 132 and may reflect light incident through the second contact electrode 132.

The reflection layer 134 may include a metal. For example, the reflection layer 134 may be a single layer or a multi-layer made of a material selected from Ag, Ni, Al, Rh, Pd, Ir, Ru, Mg, Zn, Pt, Au, Hf, and an alloy of two or more of the listed materials.

Next, a capping layer 136 may be formed above the reflection layer 134. The second contact electrode 132, the reflection layer 134, and the capping layer 136 may be collectively referred to as a second electrode layer 130. The second electrode layer 130 may supply power from a pad electrode 180 to the second conductive semiconductor layer 116.

The capping layer 136 may be disposed above the reflection layer 134 to supply the power from the pad electrode 180 to the reflection layer 134. The capping layer 136 may function as a current-spreading layer.

The capping layer 136 may include a metal and may include at least one of Sn, Ga, In, Bi, Cu, Ni, Ag, Mo, Al, Au, Nb, W, Ti, Cr, Ta, Al, Pd, Pt, Si, and selective alloys thereof as a material having high conductivity.

Subsequently, an insulation layer 140 may be formed above the capping layer 136 and the channel layer 120.

The insulation layer 140 may be formed to expose the first contact electrode 160.

The insulation layer 140 electrically insulates the first contact electrode 160 from other semiconductor layers.

Additionally, the insulation layer 140 may be disposed between a first electrode layer 150 to be formed and the channel layer 120 to block electrical contact therebetween.

The insulation layer 140 may be made of a material selected from $SiO_2$, $SiO_x$, $SiO_xN_y$, $Si_3N_4$, $Al_2O_3$, and $TiO_2$.

The reflectivity of the insulation layer 140 may exceed 50%. For example, the insulation layer 140 may be made of an insulating material selected from $SiO_2$, $SiO_x$, $SiO_xN_y$, $Si_3N_4$, $Al_2O_3$, and $TiO_2$, and may be made of a mixture of the insulating material and a light-reflecting material.

For example, the insulation layer 140 may be made of a mixture of the insulating material and one or more materials selected from Ag, Ni, Al, Rh, Pd, Ir, Ru, Mg, Zn, Pt, Au, and Hf.

According to the embodiment, a physical property of the insulation layer 140 formed between the first contact electrode 160 and the plurality of holes H is formed by a reflection layer material, so that light absorption in the insulation layer 140 performing a passivation function is minimized, thereby increasing luminous efficiency.

Figure 9:
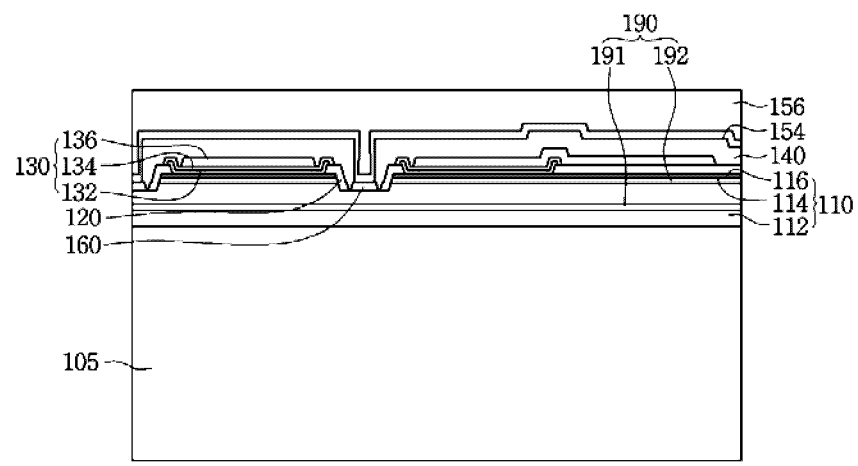

Subsequently, as illustrated in FIG. 9, a diffusion barrier layer 154 may be formed above the insulation layer 140 and the first contact electrode 160, and a bonding layer 156 may be formed above the diffusion barrier layer 154

The diffusion barrier layer 154 or the bonding layer 156 may include at least one of Ti, Au, Sn, Ni, Cr, Ga, In, Bi, Cu, Ag, and Ta.

The diffusion barrier layer 154 or the bonding layer 156 may be formed by using at least one of a deposition method, a sputtering method, and a plating method, and may be attached with a conductive sheet.

The bonding layer 156 may not be formed, but the present invention is not limited thereto.

Figure 10:
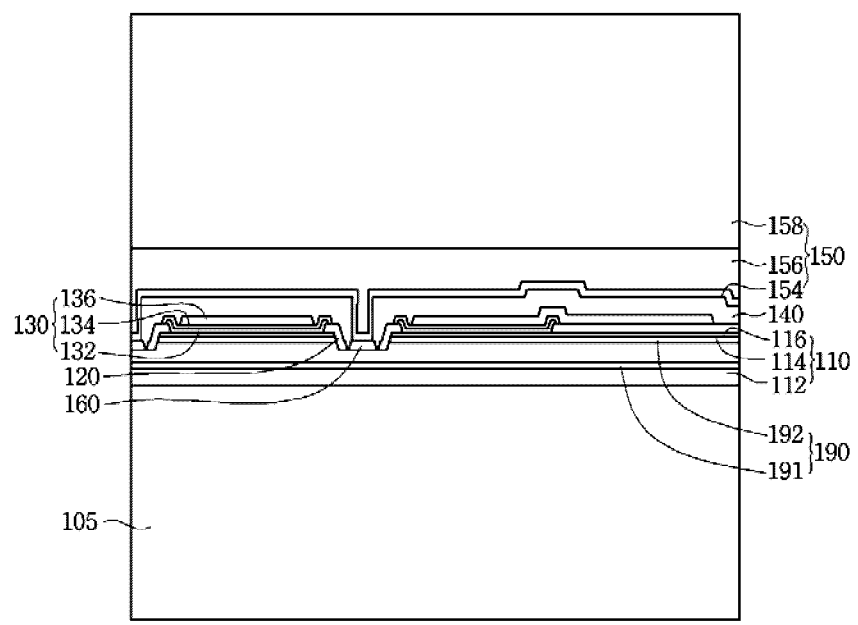

Subsequently, as illustrated in FIG. 10, a support member 158 may be formed above the bonding layer 156.

The diffusion barrier layer 154, the bonding layer 156, and the support member 158 may be collectively referred to as a first electrode layer 150, and the first electrode layer 150 may supply power from a lower electrode 159 to the first conductive semiconductor layer 112.

The support member 158 may be bonded to the bonding layer 156, but is not limited thereto.

The support member 158 may be a conductive support member, and a base substrate of the support member 158 may be at least one of Cu, Au, Ni, Mo, and Cu—W.

Additionally, the support member 158 may be realized by a carrier wafer (e.g., Si, Ge, GaAs, ZnO, SiC, SiGe, $Ga_2O_3$, GaN, etc.), and may be bonded on a circuit pattern of a board or a lead frame of a package by solder.

Figure 11:
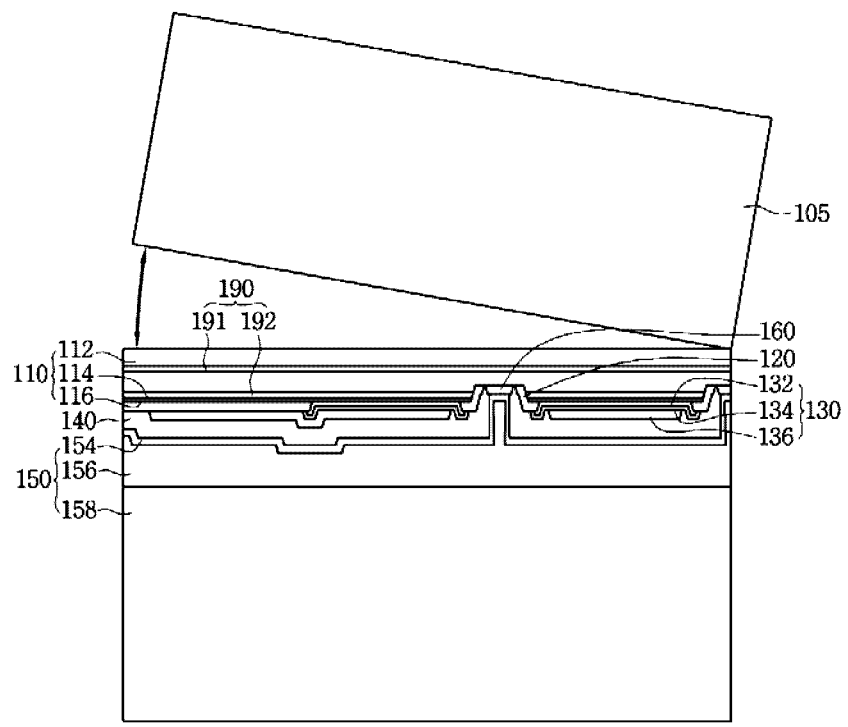

Subsequently, as illustrated in FIG. 11, the growth substrate 105 may be removed. At this time, the surface of the first conductive semiconductor layer 112 may be exposed by removing the undoped semiconductor layer (not illustrated) or the like remaining after the removal of the growth substrate 105.

The growth substrate 105 may be removed by a physical and/or chemical method. For example, the growth substrate 105 may be removed by a laser lift off (LLO) process. For example, the growth substrate 105 is lifted off by a method of irradiating a laser beam having, a wavelength of a predetermined region on the growth substrate 105.

Alternatively, the growth substrate 105 may be separated by removing the buffer layer (not illustrated) by using a wet etching solution, wherein the buffer layer is disposed between the growth substrate 105 and the first conductive semiconductor layer 112.

The top surface of the first conductive semiconductor layer 112 may be exposed by removing the growth substrate 105 and removing the buffer layer through etching or polishing.

The top surface of the first conductive semiconductor layer 112 is an N-face, and may be a surface closer to the growth substrate.

The top surface of the first conductive semiconductor layer 112 may be etched by inductively coupled plasma/reactive ion etching (ICP/RIE) or the like, or may be polished by a polishing apparatus.

Figure 12:
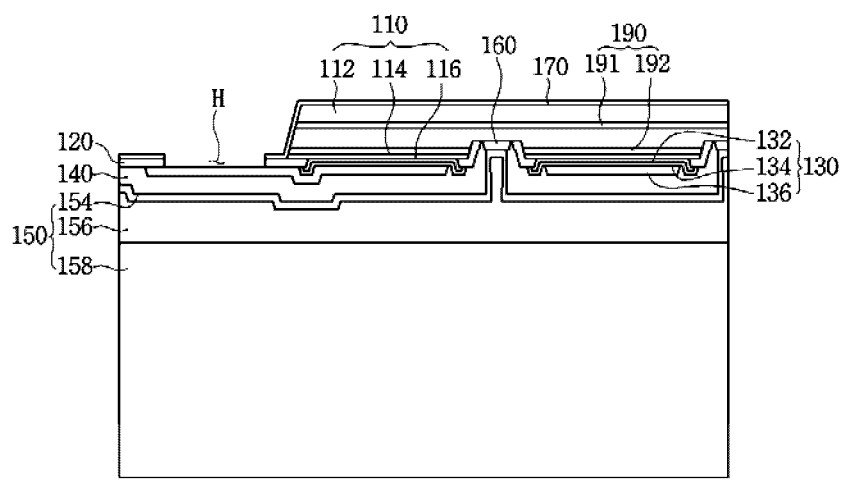

Subsequently, as illustrated in FIG. 12, a part of the light-emitting structure layer 110 may be removed to expose a part of the channel layer 120.

For example, parts of the first conductive semiconductor layer 112, the active layer 114, and the second conductive semiconductor layer 116 in the region where the pad electrode 180 is to be formed may be removed.

For example, a periphery of the light-emitting structure layer 110, i.e., a channel region or an isolation region that is a boundary between chips, may be removed by performing wet etching or dry etching, and the channel layer 120 may be exposed.

A light extraction structure may be formed on the top surface of the first conductive semiconductor layer 112, and the light extraction structure may be formed to have a roughness or a pattern. The light extraction structure may be formed by wet etching or dry etching.

Figure 13:
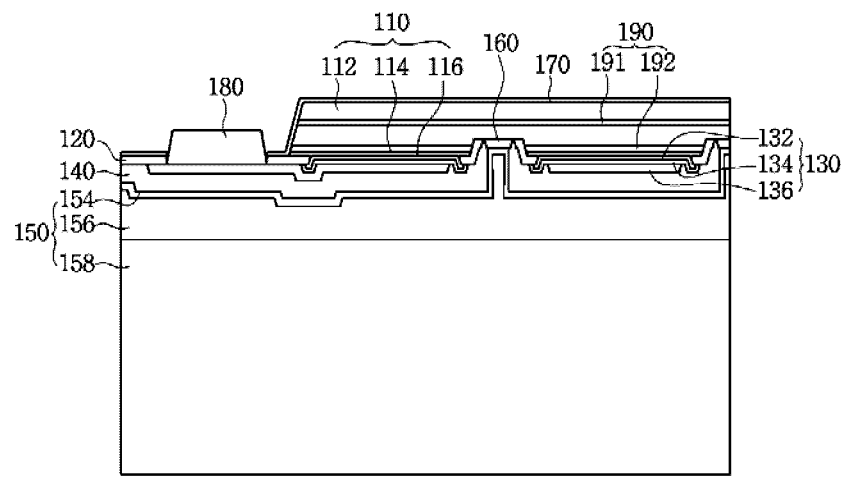

Subsequently, as illustrated in FIG. 13, a passivation layer 170 may be formed above the exposed channel layer 120 and the light-emitting structure layer 110.

Subsequently, parts of the passivation layer 170 and the channel layer 120 in a region where a pad electrode 180 is to be formed may be removed to expose a part of the capping layer 136.

Subsequently, a pad electrode 180 may be formed above the exposed capping layer 136.

The pad electrode 180 may be made of Ti/Au or the like, but is not limited thereto.

The pad electrode 180 is a region to be bonded with a wire and may be disposed in a predetermined region of the light-emitting structure layer 110. The pad electrode 180 may be provided with one or more pad electrodes.

Additionally, as illustrated in FIG. 2, a first electrode 159 may be formed below the first electrode layer 150. The first electrode 159 may be made of a material having high conductivity, for example, Ti, Al, or Ni, but is not limited thereto.

According to the embodiment, it is possible to provide a light-emitting element capable of improving luminous flux, a method for producing the same, a light-emitting element package, and a lighting system.

Figure 14A:
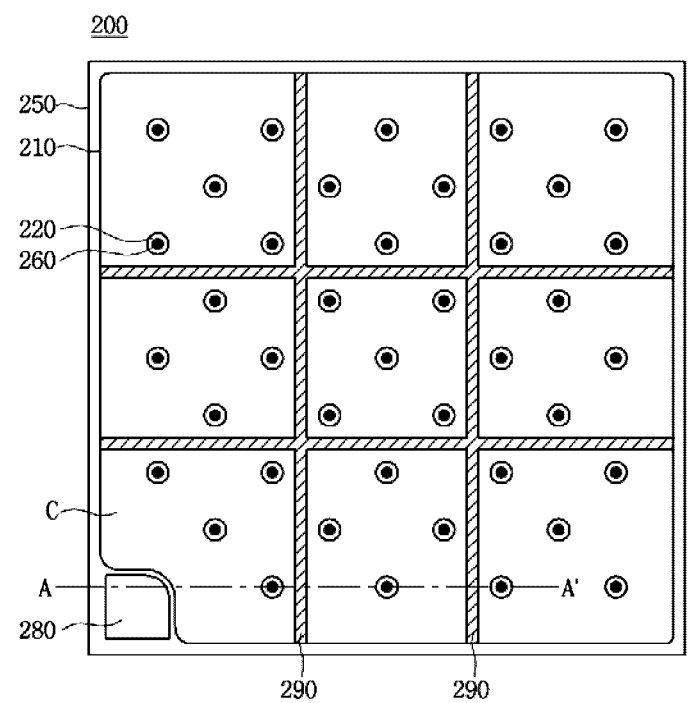
FIG. 14a is a plan projection view of a light-emitting element according to another embodiment.
Figure 14B:
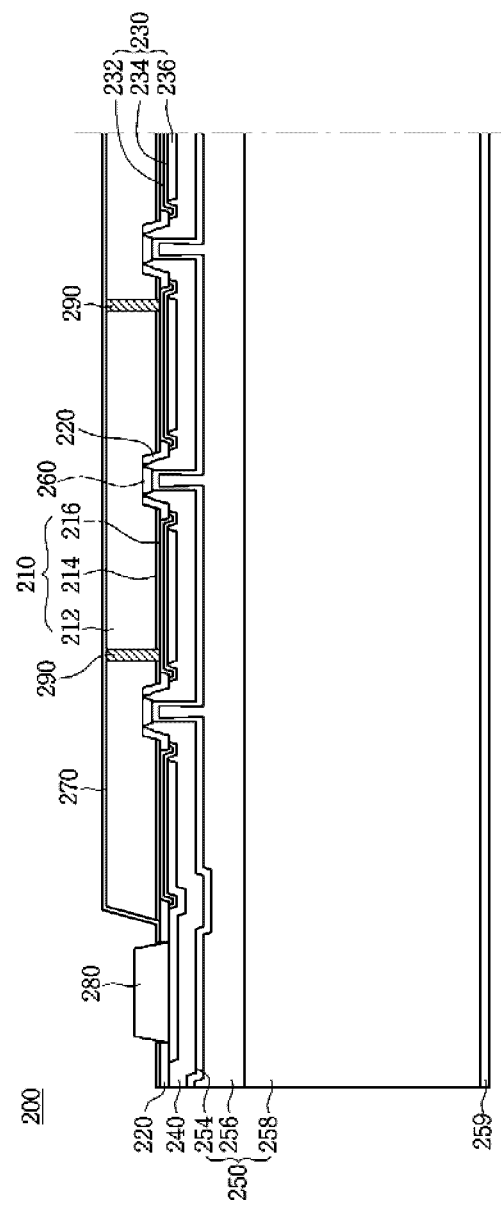
FIG. 14b is an enlarged cross-sectional view of a light-emitting element according to another embodiment.

FIG. 14a is a plan projection view of a light-emitting element 200 according to another embodiment, and FIG. 14b is an enlarged cross-sectional view taken along line A-A' of FIG. 14a.

The light-emitting element 200 according to another embodiment may include: a first conductive semiconductor layer 212; a second conductive semiconductor layer 216 disposed below the first conductive semiconductor layer 212; an active layer 214 disposed between the first conductive semiconductor layer 212 and the second conductive semiconductor layer 216; a plurality of holes H exposing parts of the first conductive semiconductor layer 212 to the bottom surface of the second conductive semiconductor layer 216 by penetrating the second conductive semiconductor layer 216 and the active layer 214; first contact electrodes 260 electrically connected to the first conductive semiconductor layer 212 from the bottom surface of the second conductive semiconductor layer 216 through the plurality of holes H; an insulation layer 240 disposed between the first contact electrodes 260 and the plurality of holes H; a first electrode layer 250 electrically connected to the first contact electrodes 260; and second contact electrodes 232 electrically connected to the second conductive semiconductor layer 216.

The first conductive semiconductor layer 212, the second conductive semiconductor layer 216, and the active layer 214 may be collectively referred to as a light-emitting structure layer 210.

Another embodiment may provide a high-efficiency low-current light-emitting element chip structure.

To this end, another embodiment may include a division layer 290 which divides the light-emitting structure layer 210 into a plurality of cells C.

The division layer 290 may include an insulating material. For example, the division layer 290 may be made of an insulating material selected from $SiO_x$, $SiO_xN_y$, $Al_2O_3$, and $TiO_2$, and may be made of a mixture of the insulating material and a light-reflecting material.

For example, the division layer 290 may be made of a mixture of the insulating material and one or more materials selected from Ag, Ni, Al, Rh, Pd, Ir, Ru, Mg, Zn, Pt, Au, and Hf.

According to another embodiment, since the light-emitting structure layer 210 can be electrically divided into the cells C by using the division layer. 290 made of the insulating material or the like, a height of the division layer 290 may start from the second conductive semiconductor layer 216 and the division layer 290 may penetrate the active layer 214 and the first conductive semiconductor layer 212. When the undoped semiconductor layer (not illustrated) or the like is present, the division layer 290 may penetrate the undoped semiconductor layer and contact the passivation layer 270.

Figure 15:
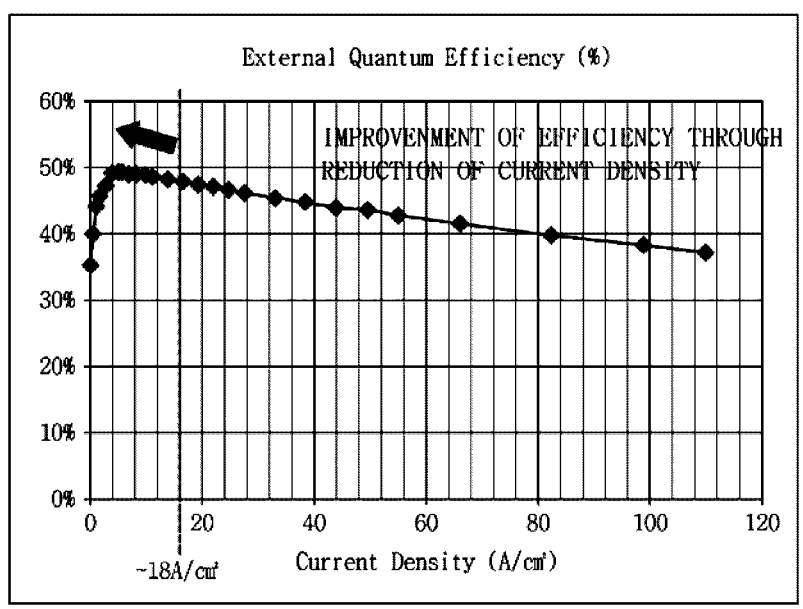
FIG. 15 is a luminous efficiency graph of a light-emitting element according to another embodiment.

FIG. 15 is a luminous efficiency graph of a light-emitting element according to another embodiment.

According to another embodiment, each cell C has a low resistance because a volume of an epi-structure is reduced, and each cell C can perform a low-current operation at the same voltage because the cells S are electrically connected in parallel.

For example, according to another embodiment, the cell C can operate at about 18 A/cm$^2$ and external quantum efficiency increases because high-current injection is not involved.

Therefore, according to another embodiment, it is possible to prevent emission efficiency droop caused by an increase in current density.

In addition, since the number of defects per cell area decreases, it is possible to prevent a decrease of a large-sized chip production yield.

According to another embodiment, it is possible to provide a large-sized light-emitting element exhibiting high luminous efficiency at a low current, a method for producing the same, a light-emitting element package, and a lighting system.

Hereinafter, a method for producing a light-emitting element according to another embodiment will be described with reference to FIGS. 16 to 29.

Figure 16:
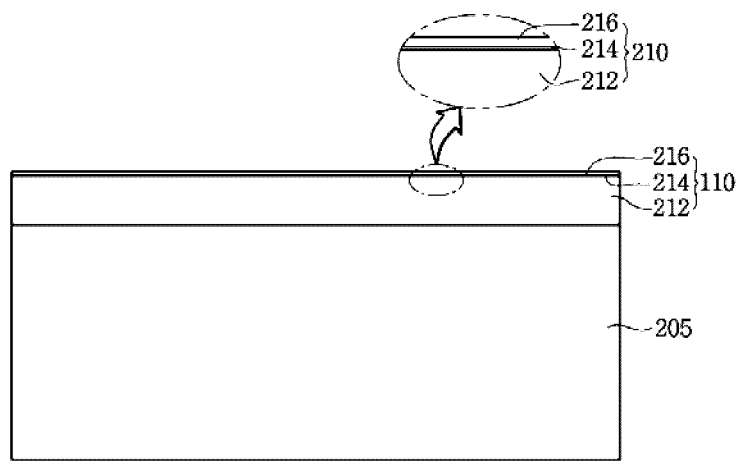
FIGS. 16 to 29 are process cross-sectional views of a method for producing a light-emitting element according to another embodiment.

First, as illustrated in FIG. 16, a light-emitting structure layer 210 may be formed above a growth substrate 205. The light-emitting structure layer 210 may include a first conductive semiconductor layer 212, an active layer 214, and a second conductive semiconductor layer 216.

The growth substrate 205 is loaded into a growth apparatus, and a layer or a pattern may be formed above the growth substrate 205 by using a compound semiconductor of group II to VI elements.

The growth apparatus may employ an electron beam evaporator, a PVD apparatus, a CVD apparatus, a PLD apparatus, a dual-type thermal evaporator, a sputtering apparatus, an MOCVD apparatus, or the like, but is not limited to these apparatuses.

The growth substrate 205 may be a conductive substrate or an insulating substrate. For example, the growth substrate 205 may be selected from the group consisting of a sapphire substrate ($Al_2O_3$), GaN, SiC, ZnO, Si, GaP, InP, $Ga_2O_3$, and GaAs.

A buffer layer (not illustrated) may be formed above the growth substrate 205. The buffer layer reduces a difference of a lattice constant between the growth substrate 205 and a nitride semiconductor layer and may be made of a material selected from GaN, AlN, AlGaN, InGaN, InN, InAlGaN, AlInN, AlGaAs, GaP, GaAs, GaAsP, and AlGaInP.

An undoped semiconductor layer (not illustrated) may be formed above the buffer layer. The undoped semiconductor layer may be made of an undoped GaN-based semiconductor. The undoped semiconductor layer may be a semiconductor layer having lower conductivity than that of an n-type semiconductor layer.

A first conductive semiconductor layer 212 may be formed above the buffer layer or the undoped semiconductor layer. Subsequently, an active layer 214 may be formed above the first conductive semiconductor layer 212, and a second conductive semiconductor layer 216 may be sequentially stacked above the active layer 214.

Another layer may be further disposed above or below each of the above-described semiconductor layers. For example, a superlattice structure may be formed by using a group III-V compound semiconductor layer, but the present invention is not limited thereto.

The first conductive semiconductor layer 212 may be selected from compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. For example, the first conductive semiconductor layer 212 may be a semiconductor layer having an empirical formula of $In_xAl_yGa_{1-x-y}N$ ($0 \le x \le 1$, $0 \le y \le 1$, $0 \le x+y \le 1$).

The first conductive semiconductor layer 212 may be a n-type semiconductor layer, and the first conductive dopant may include an n-type dopant such as Si, Ge, Sn, Se, and Te.

The first conductive semiconductor layer 212 may be a single layer or a multi-layer, and may have a superlattice structure in which two different layers selected from GaN, AlN, AlGaN, InGaN, InN, InAlGaN, AlInN, AlGaAs, GaP, GaAs, GaAsP, and AlGaInP are alternately disposed.

The active layer 214 may have a single quantum well structure, a multiple quantum well structure, a quantum wire structure, or a quantum dot structure. The active layer 214 may be formed by using a compound semiconductor material of group III-V elements in a cycle of a well layer and a barrier layer. The well layer may include a semiconductor layer having an empirical formula of $In_xAl_yGa_{1-x-y}N$ ($0 \le x \le 1$, $0 \le y \le 1$, $0 \le x+y \le 1$), and the barrier layer may include a semiconductor layer having an empirical formula of $In_xAl_{1-y}Ga_{1-x-y}N$ ($0 \le x \le 1$, $0 \le y \le 1$, $0 \le x+y \le 1$). The barrier layer may be made of a material having a higher band gap than that of the well layer.

The active layer 214 may have at least one cycle selected from, for example, a cycle of InGaN well layer/GaN barrier layer, a cycle of InGaN well layer/AlGaN barrier layer, and a cycle of InGaN well layer/InGaN barrier layer.

The second conductive semiconductor layer 216 may be formed above the active layer 214, and the second conductive semiconductor layer 216 may be selected from compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. The second conductive semiconductor layer 216 may be a semiconductor layer having an empirical formula of $In_xAl_yGa_{1-x-y}N$ (0≤x≤1, 0≤y≤1, 0≤x+y≤1).

The second conductive semiconductor layer 216 may be a p-type semiconductor layer, and the second conductive dopant may include a p-type dopant such as Mg and Zn. The second conductive semiconductor layer 216 may be a single layer or a multi-layer, but is not limited thereto.

The second conductive semiconductor layer 216 may have a superlattice structure in which two different layers selected from GaN, AlN, AlGaN, InGaN, InN, InAlGaN, AlInN, AlGaAs, GaP, GaAs, GaAsP, and AlGaInP are alternately disposed.

The first conductive semiconductor layer 212, the active layer 214, and the second conductive semiconductor layer 216 may be defined as a light-emitting structure layer 210. Additionally, a third conductive semiconductor layer (not illustrated), for example, a semiconductor layer having an opposite polarity to the second conductive semiconductor layer, may be formed above the second conductive semiconductor layer 216.

Accordingly, the light-emitting structure layer 210 may include at least one selected from an n-p junction structure, a p-n junction structure, an n-p-n junction structure, and a p-n-p junction structure. In the following description, it is assumed that the second conductive semiconductor layer 216 is disposed on the uppermost layer of the light-emitting structure layer 210.

Figure 17:
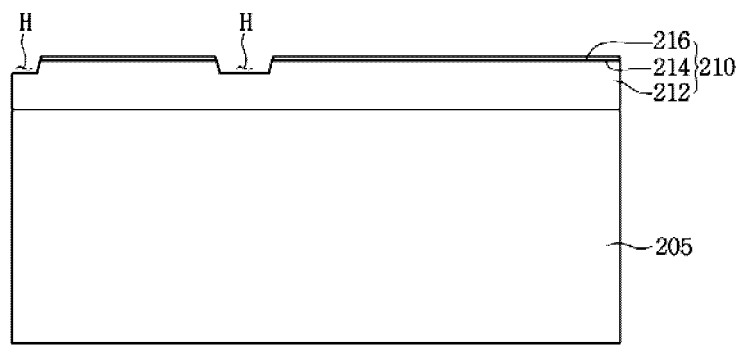

Subsequently, as illustrated in FIG. 17, a mesa etching process may be performed to remove a part of the light-emitting structure.

For example, a plurality of holes H exposing parts of the first conductive semiconductor layer 212 by penetrating the second conductive semiconductor layer 216 and the active layer 214 may be formed.

In another embodiment, the plurality of holes H may form a predetermined angle from the first conductive semiconductor layer 212 to the top surface of the second conductive semiconductor layer 216, for example, an obtuse angle with respect to the top surface of the light-emitting structure layer 210.

In another embodiment, a horizontal width of the plurality of holes H may be gradually reduced downward. On the other hand, in FIG. 15, the horizontal width of the plurality of holes H may be gradually reduced upward.

With reference to FIG. 15, according to another embodiment, since the horizontal width of the plurality of holes H is gradually reduced upward, the removed regions of the active layer 214 and the first conductive semiconductor layer 212 may be reduced, contributing to luminous efficiency.

Figure 18:
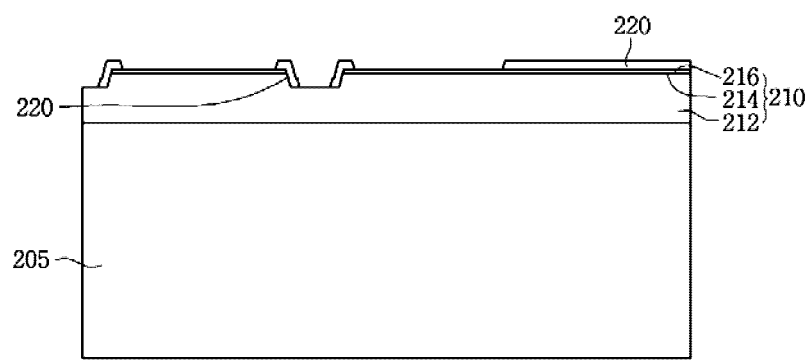

Subsequently, as illustrated in FIG. 18, a channel layer 220 may be formed above the plurality of holes H. The channel layer 220 may not be formed in a region where a first contact electrode 260 is to be formed. In this way, a part of the first conductive semiconductor layer 212 may be exposed.

The channel layer 220 serves as an electrically insulating layer between the first contact electrode 260 to be formed, the active layer 214, and the second conductive semiconductor layer 216.

The channel layer 220 may be made of one or more materials selected from $SiO_x$, $SiO_xN_y$, $Al_2O_3$, and $TiO_2$.

Additionally, in another embodiment, the reflectivity of the channel layer 220 may exceed 50%. For example, the channel layer 220 may be made of an insulating material selected from $SiO_2$, $SiO_x$, $SiO_xN_y$, $Si_3N_4$, $Al_2O_3$, and $TiO_2$, and may be made of a mixture of the insulating material and a light-reflecting material.

For example, the channel layer 220 may be made of a mixture of the insulating material and one or more materials selected from Ag, Ni, Al, Rh, Pd, Ir, Ru, Mg, Zn, Pt, Au, and Hf.

According to another embodiment, when the emitted light travels downward, the channel layer 220 also reflects the light, thereby minimizing light absorption and increasing luminous efficiency.

Figure 19:
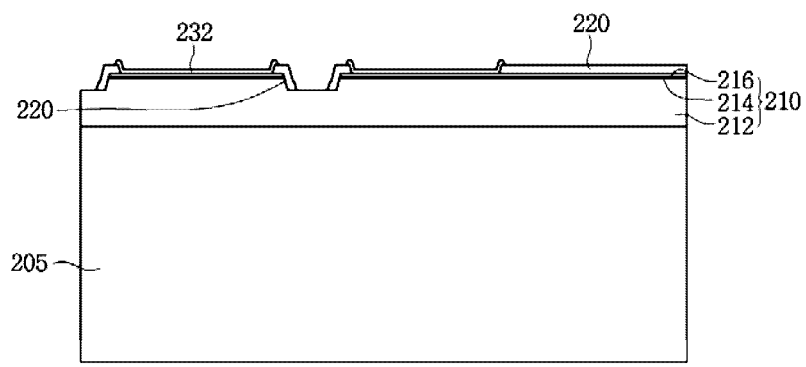

Subsequently, as illustrated in FIG. 19, a second contact electrode 232 may be formed above the second conductive semiconductor layer 216.

The second contact electrode 232 ohmic-contacts the second conductive semiconductor layer 216. The second contact electrode 232 may include at least one conductive material and may be a single layer or a multi-layer.

For example, the second contact electrode 232 may include at least one of a metal, a metal oxide, and a metal nitride.

The second contact electrode 232 may include a light-transmitting material. For example, the second contact electrode 132 may include at least one of ITO, IZO, IZON, IZTO, IAZO, IGZO, IGTO, AZO, ATO, GZO, $IrO_x$, $RuO_x$, $RuO_x$/ITO, Ni/$IrO_x$/Au, Ni/$IrO_x$/Au/ITO, Pt, Ni, Au, Rh, and Pd.

Figure 20:
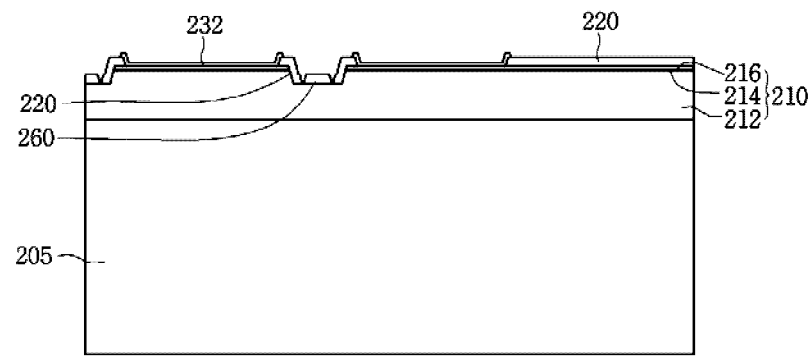

Subsequently, as illustrated in FIG. 20, a first contact electrode 260 may be formed above the exposed first conductive semiconductor layer 212.

The first contact electrode 260 may ohmic-contact the exposed first conductive semiconductor layer 212. When viewed from above, the first contact electrode 260 may have a circular or polygonal shape, but is not limited thereto.

The top surface of the first contact electrode 260 may be disposed between the top surface of the active layer 214 and the top surface of the first conductive semiconductor layer 212.

The surface of the first conductive semiconductor layer 212, which contacts the first contact electrode 260, may be formed to have a flat structure as a Ga-face, but is not limited thereto.

With reference to FIG. 20, in another embodiment, the width of the first contact electrode 260 may gradually increase toward the top surface from the bottom surface. With reference to FIG. 15, the width of first contact electrode 260 may be gradually reduced toward the bottom surface from the top surface.

In this way, a probability of shorting between the first contact electrode 260 and a second electrode layer 230 to be formed later is reduced, and a region occupied by the first contact electrode 260 is reduced while maximizing a region where the first contact electrode 260 contacts the first conductive semiconductor layer 212, thereby increasing luminous efficiency.

When described with reference to FIG. 15, a horizontal width of the bottom surface of the first contact electrode 260 matches a horizontal width of a diffusion barrier layer 254 contacting the first contact electrode 260. Thus, it is possible to prevent deterioration of electrical characteristics while minimizing a region occupied by the diffusion barrier layer 254 and the first contact electrode 260.

Figure 21:
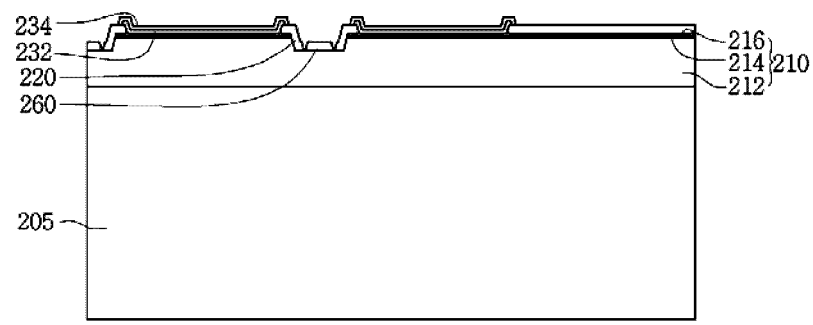

Subsequently, as illustrated in FIG. 21, a reflection layer 234 may be formed above the second contact electrode 232.

The reflection layer 234 may be disposed above the second contact electrode 232 and may reflect light incident through the second contact electrode 232.

The reflection layer 234 may include a metal. For example, the reflection layer 134 may be a single layer or a multi-layer made of a material selected from Ag, Ni, Al, Rh, Pd, Ir, Ru, Mg, Zn, Pt, Au, Hf, and an alloy of two or more of the listed materials.

Figure 22:
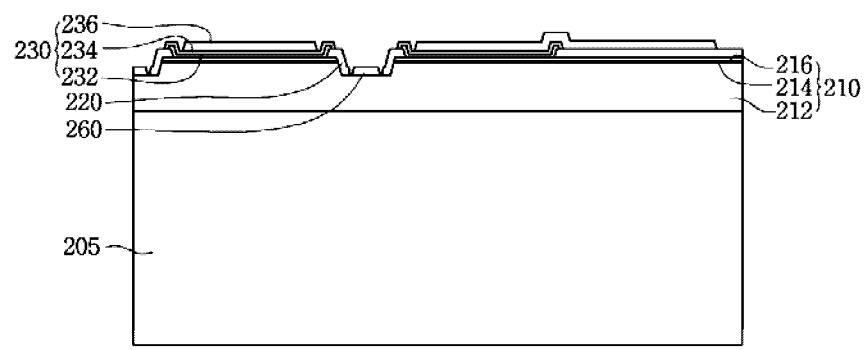

Subsequently, as illustrated in FIG. 22, a capping layer 236 may be formed above the reflection layer 234.

The second contact electrode 232, the reflection layer 234, and the capping layer 236 may be collectively referred to as a second electrode layer 230. The second electrode layer 230 may supply the power from a pad electrode 280 to the second conductive semiconductor layer 216.

The capping layer 236 may be disposed above the reflection layer 234 to supply the power from the pad electrode 280 to the reflection layer 234. The capping layer 236 may function as a current-spreading layer.

The capping layer 236 may include a metal and may include at least one of Sn, Ga, In, Bi, Cu, Ni, Ag, Mo, Al, Au, Nb, W, Ti, Cr, Ta, Al, Pd, Pt, Si, and selective alloys thereof as a material having high conductivity.

Figure 23:
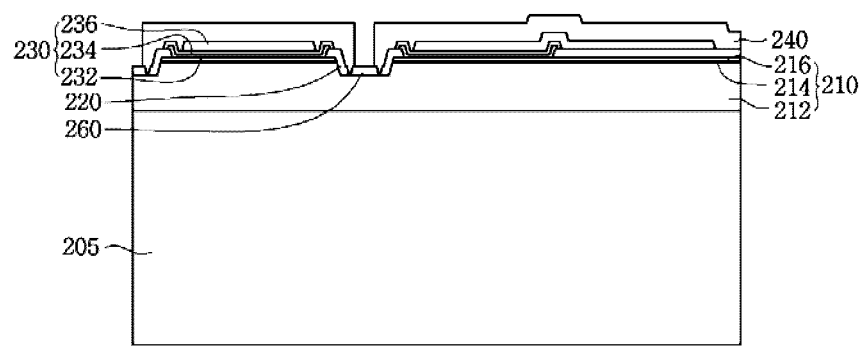

Subsequently, as illustrated in FIG. 23, an insulation layer 240 may be formed above the capping layer 236 and the channel layer 220.

The insulation layer 240 may be formed to expose the first contact electrode 260.

The insulation layer 240 electrically insulates the first contact electrode 260 from other semiconductor layers.

Additionally, the insulation layer 240 may be disposed between a first electrode layer 250 to be formed and the channel layer 220 to block electrical contact therebetween.

The insulation layer 240 may be made of a material selected from $SiO_2$, $SiO_x$, $SiO_xN_y$, $Si_3N_4$, $Al_2O_3$, and $TiO_2$.

As described above, the reflectivity of the insulation layer 240 may exceed 50%. For example, the insulation layer 240 may be made of an insulating material selected from $SiO_2$, $SiO_x$, $SiO_xN_y$, $Si_3N_4$, $Al_2O_3$, and $TiO_2$, and may be made of a mixture of the insulating material and a light-reflecting material.

For example, the insulation layer 240 may be made of a mixture of the insulating material and one or more materials selected from Ag, Ni, Al, Rh, Pd, Ir, Ru, Mg, Zn, Pt, Au, and Hf.

According to another embodiment, a physical property of the insulation layer 240 formed between the first contact electrode 260 and the plurality of holes H is formed by a reflection layer material, so that light absorption in the insulation layer 240 performing a passivation function is minimized, thereby increasing luminous efficiency.

Additionally, a thickness of the insulation layer 240 may be in a range of about 1 μm to about 2 μm.

According to another embodiment, a thickness ratio of the insulation layer 240 formed between the first contact electrode 260 and the plurality of holes H is optimally controlled to perform a shorting prevention function and prevent a reduction in luminous efficiency.

The light-emitting element according to another embodiment can increase luminous efficiency by controlling a thickness ratio or a physical property of the passivation layer.

Figure 24:
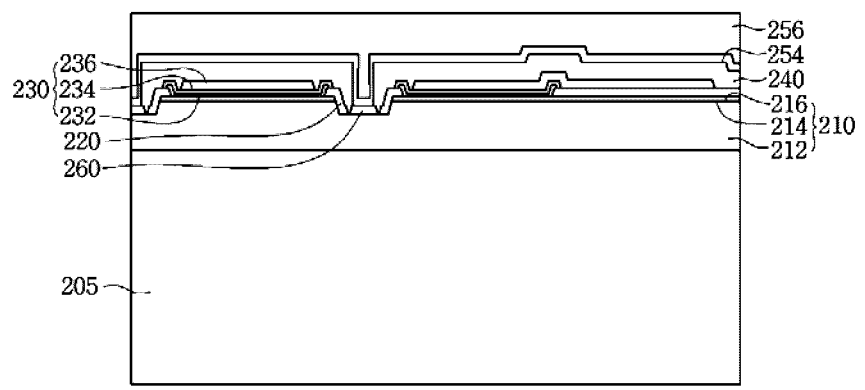

Subsequently, as illustrated in FIG. 24, a diffusion barrier layer 254 may be formed above the insulation layer 240 and the first contact electrode 260, and a bonding layer 256 may be formed above the diffusion barrier layer 254

The diffusion barrier layer 254 and/or the bonding layer 256 may include at least one of Ti, Au, Sn, Ni, Cr, Ga, In, Bi, Cu, Ag, and Ta.

The diffusion barrier layer 254 and/or the bonding layer 256 may be formed by using at least one of a deposition method, a sputtering method, and a plating method, and may be attached with a conductive sheet.

The bonding layer 256 may not be formed, but the present invention is not limited thereto.

Figure 25:
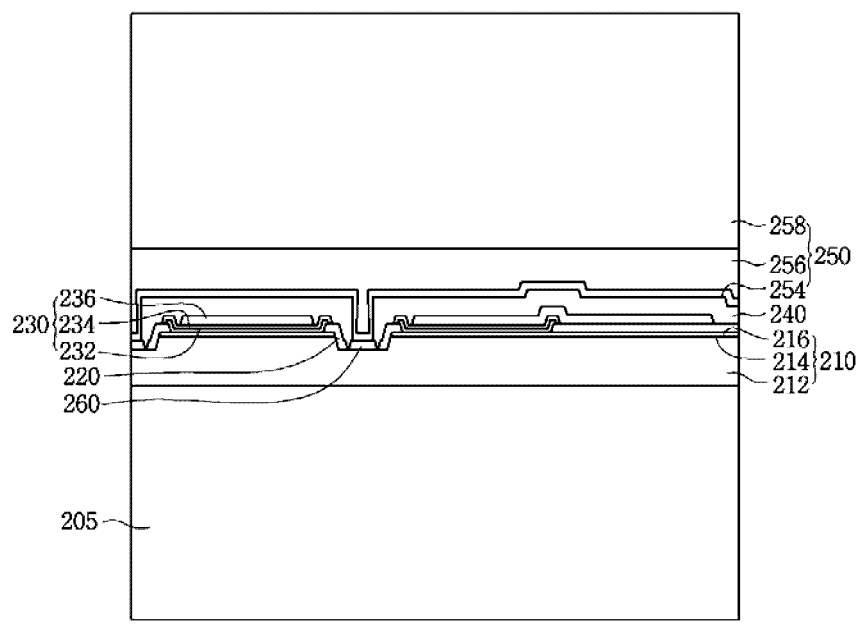

Subsequently, as illustrated in FIG. 25, a support member 258 may be formed above the bonding layer 256.

The diffusion barrier layer 254, the bonding layer 256, and the support member 258 may be collectively referred to as a first electrode layer 250, and the first electrode layer 250 may supply power from a lower electrode 259 to the first conductive semiconductor layer 212.

The support member 258 may be bonded to the bonding layer 256, but is not limited thereto.

The support member 258 may be a conductive support member, and a base substrate of the support member 158 may be at least one of Cu, Au, Ni, Mo, and Cu—W.

Additionally, the support member 258 may be realized by a carrier wafer (e.g., Si, Ge, GaAs, ZnO, SiC, SiGe, $Ga_2O_3$, GaN, etc.), and may be bonded on a circuit pattern of a board or a lead frame of a package by solder.

Figure 26:
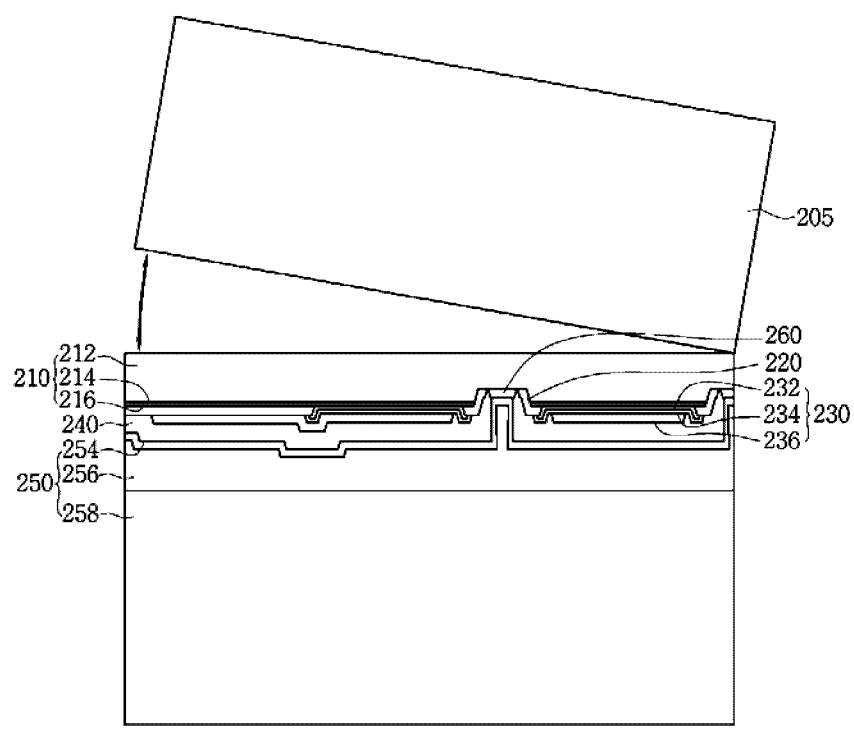

Subsequently, as illustrated in FIG. 26, the growth substrate 205 may be removed. At this time, the surface of the first conductive semiconductor layer 212 may be exposed by removing the undoped semiconductor layer (not illustrated) or the like remaining after the removal of the growth substrate 205.

The growth substrate 205 may be removed by a physical and/or chemical method. For example, the growth substrate 205 may be removed by an LLO process. For example, the growth substrate 205 is lifted off by a method of irradiating a laser beam having a wavelength of a predetermined region on the growth substrate 205.

Alternatively, the growth substrate 205 may be separated by removing the buffer layer (not illustrated) by using a wet etching solution, wherein the buffer layer is disposed between the growth substrate 205 and the first conductive semiconductor layer 212.

The top surface of the first conductive semiconductor layer 212 may be exposed by removing the growth substrate 205 and removing the buffer layer through etching or polishing.

The top surface of the first conductive semiconductor layer 212 is an N-face, and may be a surface closer to the growth substrate.

The top surface of the first conductive semiconductor layer 212 may be etched by inductively coupled plasma/reactive ion etching (ICP/RIE) or the like, or may be polished by a polishing apparatus.

Figure 27:
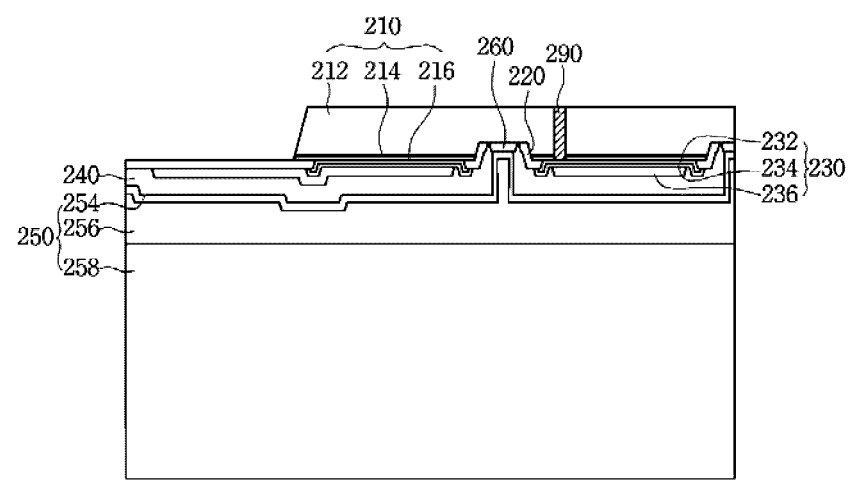

Subsequently, as illustrated in FIG. 27, a part of the light-emitting structure layer 210 may be removed to expose a part of the channel layer 220.

For example, parts of the first conductive semiconductor layer 212, the active layer 214, and the second conductive semiconductor layer 216 in the region where the pad electrode 280 is to be formed may be removed.

For example, a periphery of the light-emitting structure layer 210, i.e., a channel region or an isolation region that is a boundary between chips, may be removed by performing wet etching or dry etching, and the channel layer 220 may be exposed.

A light extraction structure may be formed on the top surface of the first conductive semiconductor layer 212, and the light extraction structure may be formed to have a roughness or a pattern. The light extraction structure may be formed by wet etching or dry etching.

Another embodiment may include a division layer 290 which divides the light-emitting structure layer 210 into a plurality of cells C. In this way, another embodiment may provide a high-efficiency low-current light-emitting element chip structure.

According to another embodiment, since the light-emitting structure layer 210 can be electrically divided into the cells C by using the division layer 290 made of the insulating material or the like, a height of the division layer 290 may start from the second conductive semiconductor layer 216 and the division layer 290 may penetrate the active layer 214 and the first conductive semiconductor layer 212. When the undoped semiconductor layer (not illustrated) or the like is present, the division layer 290 may penetrate the undoped semiconductor layer and contact the passivation layer 270.

The division layer 290 may include an insulating material. For example, the division layer 290 may be made of an insulating material selected from $SiO_2$, $SiO_x$, $SiO_xN_y$, $Si_3N_4$, $Al_2O_3$, and $TiO_2$, and may be made of a mixture of the insulating material and a light-reflecting material.

For example, the division layer 290 may be made of a mixture of the insulating material and one or more materials selected from Ag, Ni, Al, Rh, Pd, Ir, Ru, Mg, Zn, Pt, Au, and Hf.

According to another embodiment, each cell C has a low resistance because a volume of an epi-structure is reduced, and each cell C can perform a low-current operation at the same voltage because the cells S are electrically connected in parallel.

Therefore, according to another embodiment, it is possible to prevent efficiency droop caused by an increase in current density.

In addition, since the number of defects per cell area decreases, it is possible to prevent a decrease of a large-sized chip production yield.

According to another embodiment, it is possible to provide a large-sized light-emitting element exhibiting high luminous efficiency at a low current, a method for producing the same, a light-emitting element package, and a lighting system.

Figure 28:
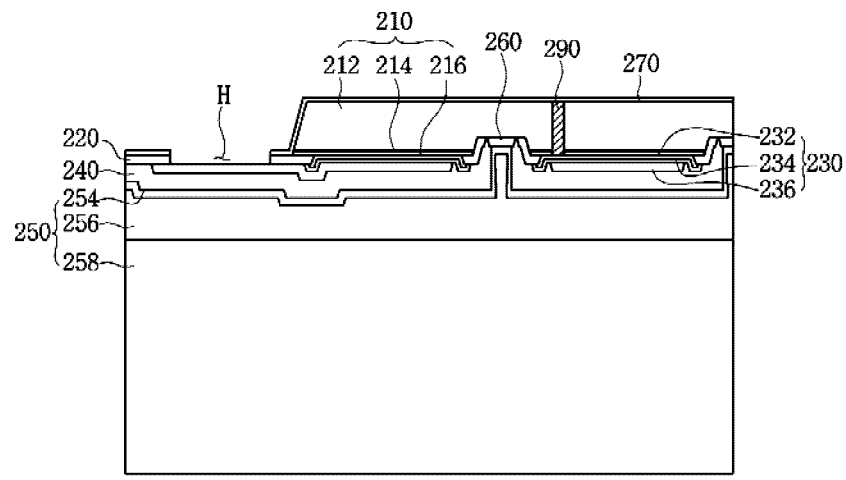

Subsequently, as illustrated in FIG. 28, a passivation layer 270 may be formed above the exposed channel layer 220 and the light-emitting structure layer 210.

Subsequently, parts of the passivation layer 270 and the channel layer 220 in a region where a pad electrode 180 is to be formed may be removed to expose a part of the capping layer 236.

The passivation layer 270 may be made of a material selected from $SiO_xN_y$, $Si_3N_4$, $Al_2O_3$, and $TiO_2$.

Figure 29:
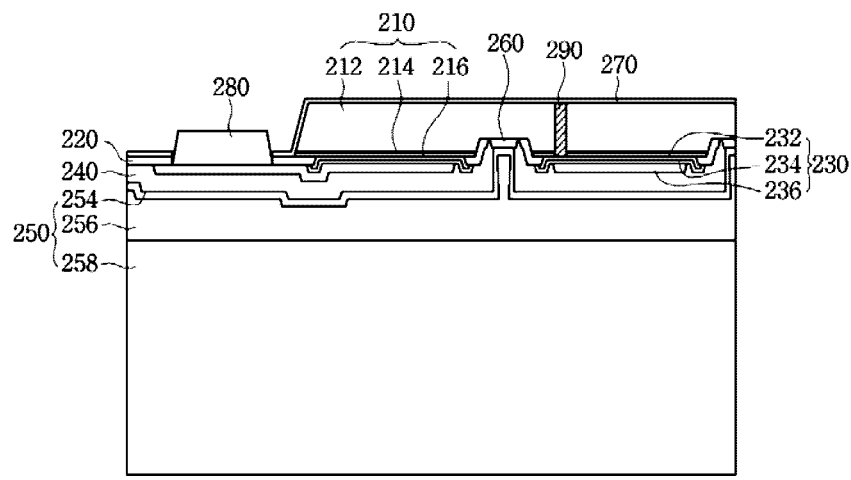

Subsequently, as illustrated in FIG. 29, a pad electrode 280 may be formed above the exposed capping layer 236.

The pad electrode 280 may be made of Ti/Au or the like, but is not limited thereto.

The pad electrode 280 is a region to be bonded with a wire and may be disposed in a predetermined region of the light-emitting structure layer 210. The pad electrode 280 may be provided with one or more pad electrodes.

Additionally, as illustrated in FIG. 29, a first electrode 259 may be formed below the first electrode layer 250. The first electrode 259 may be made of a material having high conductivity, for example, Ti, Al, or Ni, but is not limited thereto.

In the light-emitting element, the method for producing the same, the light-emitting element package, and the lighting system according to another embodiment, luminous efficiency can be increased by controlling a thickness ratio or a physical-property of the passivation layer.

Figure 30:
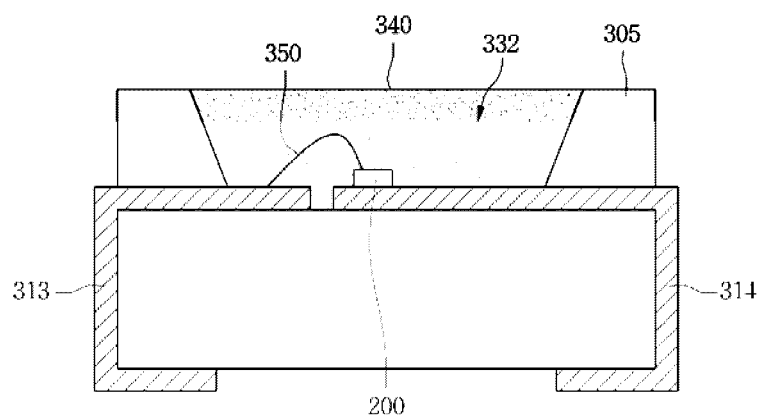
FIG. 30 is a cross-sectional view of a light-emitting element package according to an embodiment.

FIG. 30 is a view of a light-emitting element package to which the light-emitting element according to an embodiment is applied.

Referring to FIG. 30, the light-emitting element package according to the embodiment may include a body 305, a first lead electrode 313 and a second lead electrode 314 disposed in the body 305, a light-emitting element 200 provided in the body 305 and electrically connected to the first lead electrode 313 and the second lead electrode 314, and a molding member 340 surrounding the light-emitting element 200.

The body 305 may be made of a silicon material, a synthetic resin material, or a metal material, and may have an inclined surface around the light-emitting element 100.

The first lead electrode 313 and the second lead electrode 314 are electrically separated from each other and supply power to the light-emitting element 200. Additionally, the first lead electrode 313 and the second lead electrode 314 may reflect light generated by the light-emitting element 200 to thereby increase luminous efficiency, and may serve to discharge heat generated by the light-emitting element 200 to the outside.

The light-emitting element 200 may be disposed above the body 305, or may be disposed above the first lead electrode 313 or the second lead electrode 314.

The light-emitting element 100 may be electrically connected to the first lead electrode 313 and the second lead electrode 314 by any one of a wire method, a flip-chip method, and a die bonding method.

In the embodiment, the light-emitting element 200 may be mounted on the second lead electrode 314 and may be connected to the first lead electrode 313 by a wire 350, but the embodiment is not limited thereto.

The molding member 340 may surround the light-emitting element 200 so as to protect the light-emitting element 200. Additionally, the molding member 340 may include a phosphor 322 so as to change a wavelength of the light emitted by the light-emitting element 200.

A plurality of light-emitting elements or light-emitting element packages according to the embodiment may be arrayed above a substrate, and optical members, such as lens, a polarizing plate, a prism sheet, and a diffusion sheet, may be disposed on an optical path of the light-emitting element package. The light-emitting element package, the substrate, and the optical members may function as a light unit. The light unit may be implemented in a top view type or a side view type, may be provided to display devices of a mobile terminal, a notebook computer, and the like, or may be variously applied to a lighting device, an indicating device, and the like. Further another embodiment may be implemented as a lighting system including the light-emitting element or the light-emitting element package described in the above embodiments. For example, the lighting system may include a lamp, a streetlight, an electronic display, and a headlight.

Figure 31:
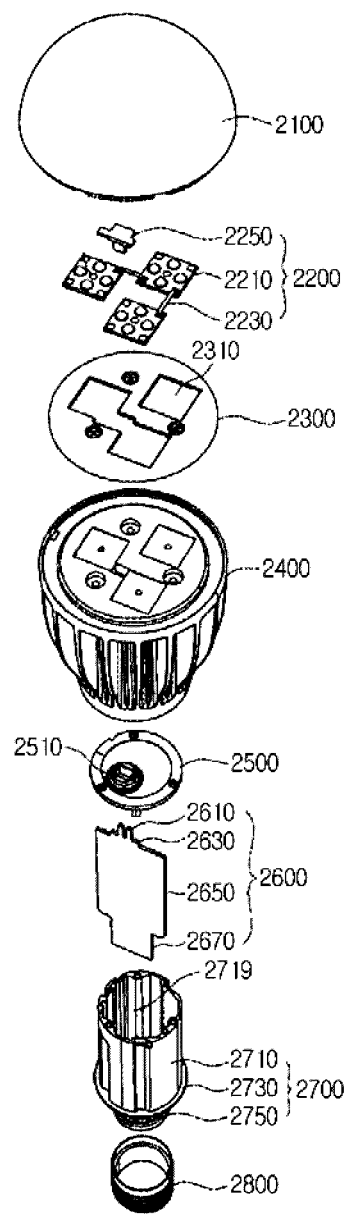
FIG. 31 is an exploded perspective view of a lighting system according to an embodiment.

FIG. 31 is an exploded perspective view of a lighting system according to an embodiment.

Referring to FIG. 31, the lighting system according to the embodiment may include a cover 3100, a light source module 3200, a radiator 3300, a power supply unit 3400, an inner case 3500, and a socket 3600. Additionally, the lighting system according to the embodiment may further include a member 3300 and/or a holder 3500. The light source module 3200 may include the light-emitting element package according to the embodiment.

For example, the cover 3100 may have a bulb or semispherical shape and may be hollow, and a part of the cover 3100 may be opened. The cover 3100 may be optically coupled to the light source module 3200. For example, the cover 3100 may diffuse, scatter, or excite light provided from the light source module 3200. The cover 3100 may be a type of optical member. The cover 3100 may be coupled to the radiator 3300. The cover 3100 may have a coupling portion which is coupled to the radiator 3300.

The inner surface of the cover 3100 may be coated with a milk-white paint. The milk-white paint may include a diffusion material which diffuses light. A surface roughness of the inner surface of the cover 3100 may be greater than a surface roughness of the outer surface of the cover 3100, so as to sufficiently scatter and diffuse the light from the light source module 3200 and discharge the light to the outside.

A material of the cover 3100 may include glass, plastic, polypropylene (PP), polyethylene (PE), polycarbonate (PC), and the like. The polycarbonate (PC) has superior light resistance, heat resistance and strength. The cover 3100 may be transparent so that a user can view the light source module 3200 from the outside, or may be opaque. The cover 3100 may be formed through blow molding.

The light source module 3200 may be disposed on one surface of the radiator 3300. Accordingly, the heat from the light source module 3200 is transferred to the radiator 3300. The light source module 3200 may include a light source unit 3210, a connection plate 3230, and a connector 3250.

The member 3300 is disposed on the radiator 3300 and includes guide grooves 3310 into which a plurality of light source units 3210 and the connector are inserted. The guide grooves 3310 corresponds to the substrate of the light source unit 3210 and the connector 3250.

A surface of the member 3300 may be deposited or coated with a light-reflecting material. A surface of the member 3300 may be deposited or coated with a white paint. The member 3300 reflects light, which is reflected by the inner surface of the cover 3100 and is returned toward the light source module 3200, again toward the cover 3100. Accordingly, the luminous efficiency of the lighting system according to the embodiment may be improved.

The member 3300 may include, for example, an insulating material. The connection plate 3230 of the light source module 3200 may include an electrically conductive material. Accordingly, the radiator 3300 may electrically contact the connection plate 3230. Since the member 3300 is made of an insulating material, the member 3300 may prevent electrical shorting between the connection plate 3230 and the radiator 3300. The radiator 3300 receives heat from the light source module 3200 and the power supply unit 3400 and radiates the heat.

The holder 3500 covers an accommodation groove 3719 of an insulating portion 3710 of the inner case 3500 Accordingly, the power supply unit 3400 accommodated in the insulating portion 3710 of the inner case 3500 is tightly sealed. The holder 3500 includes a guide protrusion 3510. The guide protrusion 3510 has a hole through which a protrusion 3610 of the power supply unit 3400 penetrates.

The power supply unit 3400 processes or converts an electric signal received from the outside and provides the processed or converted electric signal to the light source module 3200. The power supply unit 3400 is accommodated in the accommodation groove 3719 of the inner case 3500 and is sealed inside the inner case 3500 by the holder 3500.

The power supply unit 3400 may include a protrusion 3610, a guide portion 3630, a base 3650, and an extension portion 3670.

The guide portion 3630 has a shape protruding outward from one side of the base 3650. The guide portion 3630 may be inserted into the holder 3500. A plurality of components may be disposed above one surface of the base 3650. The plurality of components may include, for example, a DC converter which converts AC power supplied from an external power supply into DC power, a driving chip which controls driving of the light source module 3200, and electrostatic discharge (ESD) protection device which protects the light source module 3200, but is not limited thereto.

The extension portion 3670 has a shape protruding outward from anther side of the base 3650. The extension portion 3670 is inserted into the connection portion 3750 of the inner case 3500 and receives an electric signal from the outside. For example, a width of the extension portion 3670 may be equal to or less than a width of the connection portion 3750 of the inner case 3500. One end of a positive (+) wire and one end of a negative (−) wire may be electrically connected to the extension portion 3670, and the other end of the positive (+) wire and the other end of the negative (−) wire may be electrically connected to the socket 3600.

The inner case 3500 may include a molding portion therein together with the power supply unit 3400. The molding portion is provided by hardening a molding liquid and may fix the power supply unit 3400 to the inside of the inner case 3500;

The features, structures, and effects described above are included in at least one embodiment and are not necessarily limited to only one embodiment. Furthermore, the features, structures, and effects described in each embodiment can be carried out through combinations or modifications in other embodiments by those skilled in the art to which the embodiments pertain.

Although embodiments have been particularly shown and described, they are only for illustrative purposes and are not intended to the present invention. It will be understood that various modifications and applications can be made thereto without departing from the scope of the present invention by those skilled in the art to which the embodiments pertain. For example, the elements particularly shown in the embodiments can be carried out through modifications. It will be understood that differences related to these modifications and applications fall within the scope of the embodiments defined by the appended claims.

The invention claimed is:

1. A light-emitting element comprising:
a first conductive semiconductor layer;
a second conductive semiconductor layer disposed below the first conductive semiconductor layer;
an active layer disposed between the first conductive semiconductor layer and the second conductive semiconductor layer;
a plurality of holes exposing parts of the first conductive semiconductor layer to the bottom surface of the second conductive semiconductor layer by penetrating the second conductive semiconductor layer and the active layer;

first contact electrodes electrically connected to the first conductive semiconductor layer from the bottom surface of the second conductive semiconductor layer through the plurality of holes;

an insulation layer disposed between the first contact electrodes and the plurality of holes;

a first electrode layer electrically connected to the first contact electrodes;

a second contact electrode electrically connected to the second conductive semiconductor layer;

a first current-spreading semiconductor layer disposed into the first conductive semiconductor layer above the first contact electrodes;

a second current-spreading semiconductor layer between the active layer and the first conductive semiconductor layer;

a reflection layer under the second contact electrode;

a capping layer under the reflection layer; and a channel layer under the capping layer, wherein the reflection layer surrounds a bottom surface and a side surface of the second contact electrode, and the reflection layer contacts a bottom surface of the channel layer, and wherein the second current-spreading semiconductor layer contacts a side surface of the channel layer.

2. The lighting-emitting element of claim 1, wherein the first conductive semiconductor layer comprises a first semiconductor layer and a second semiconductor layer, wherein the first semiconductor layer is disposed on the first contact electrodes and the second semiconductor layer, and wherein the first current-spreading semiconductor layer is disposed between the first semiconductor layer and the second semiconductor layer.

3. The lighting-emitting element of claim 2, wherein the first current-spreading semiconductor layer includes a first conductive AlGaN/GaN superlattice layer or a first conductive AlGaN/GaN/InGaN superlattice layer.

4. The lighting-emitting element of claim 3, wherein the second current-spreading semiconductor layer is lower than the first contact electrodes.

5. The lighting-emitting element of claim 1, wherein the insulation layer includes a light-reflecting material.

6. The lighting-emitting element of claim 1, wherein the channel layer surrounds the first contact electrodes, and wherein the channel layer includes a light-reflecting material.

7. The lighting-emitting element of claim 1, wherein the first electrode layer comprises:

a diffusion barrier layer on the first contact electrodes; and the bonding layer on the diffusion barrier layer.

8. The lighting-emitting element of claim 7, wherein a width of each first contact electrode is gradually reduced toward the bottom surface from the top surface.

9. The lighting-emitting element of claim 1, wherein a horizontal width of the plurality of holes is gradually reduced upward.

10. A light-emitting element comprising:

a light-emitting structure layer including a first conductive semiconductor layer, a second conductive semiconductor layer, and an active layer disposed between the first conductive semiconductor layer and the second conductive semiconductor layer;

a plurality of holes exposing parts of the first conductive semiconductor layer to the bottom surface of the second conductive semiconductor layer by penetrating the second conductive semiconductor layer and the active layer;

first contact electrodes electrically connected to the first conductive semiconductor layer from the bottom surface of the second conductive semiconductor layer through the plurality of holes;

an insulation layer disposed between the first contact electrodes and the plurality of holes;

a first electrode layer electrically connected to the first contact electrodes;

a second contact electrode electrically connected to the second conductive semiconductor layer;

a division layer dividing the light-emitting structure layer into a plurality of cells;

a current-spreading semiconductor layer between the active layer and the first conductive semiconductor layer;

a reflection layer under the second contact electrode;

a capping layer under the reflection layer;

a channel layer under the capping layer; and a pad electrode on the capping layer, wherein the reflection layer surrounds a bottom surface and a side surface of the second contact electrode, and the reflection layer contacts a bottom surface of the channel layer, wherein the channel layer contacts the pad electrode, and wherein the current-spreading semiconductor layer contacts a side surface of the channel layer.

11. The lighting-emitting element of claim 10, wherein each of the plurality of cells includes at least one of first contact electrodes, and wherein the plurality of cells are electrically connected in parallel.

12. The lighting-emitting element of claim 10, wherein the division layer includes an insulating material selected from $SiO_x$, $SiO_xN_y$, $Al_2O_3$, and $TiO_2$.

13. The lighting-emitting element of claim 10, wherein the division layer includes one or more materials selected from selected from Ag, Ni, Al, Rh, Pd, Ir, Ru, Mg, Zn, Pt, Au, and Hf.

14. The lighting-emitting element of claim 10, wherein the channel layer surrounds the first contact electrodes.

15. The lighting-emitting element of claim 14, wherein the channel layer includes a light-reflecting material.

16. The lighting-emitting element of claim 10, wherein the first electrode layer comprises:

a diffusion barrier layer on the first contact electrodes; and a bonding layer on the diffusion barrier layer.

17. The lighting-emitting element of claim 16, wherein a width of each first contact electrode is gradually reduced toward the bottom surface from the top surface.

18. The lighting-emitting element of claim 10, wherein a horizontal width of the plurality of holes is gradually reduced upward.

19. The lighting-emitting element of claim 10, wherein the division layer is disposed on the second contact electrode and is directly contacted with the second contact electrode, wherein a thickness of the division layer is equal to a thickness of the light-emitting structure layer.

* * * * *